(12) United States Patent (10) Patent No.: US 12,683,111 B2
Sprenkle (45) Date of Patent: Jul. 14, 2026

(54) DYNAMIC ION BEAM SHAPE SELECTION

(71) Applicant: Applied Materials, Inc., Santa Clara, CA (US)

(72) Inventor: Richard Allen Sprenkle, South Hamilton, MA (US)

(73) Assignee: Applied Materials, Inc., Santa Clara, CA (US)

( * ) Notice: Subject to any disclaimer, the term of this patent is extended or adjusted under 35 U.S.C. 154(b) by 445 days.

(21) Appl. No.: 18/497,579

(22) Filed: Oct. 30, 2023

(65) Prior Publication Data

US 2025/0140510 A1 May 1, 2025

(51) Int. Cl.
*H01J 37/04* (2006.01)
*H01J 37/317* (2006.01)

(52) U.S. Cl.
CPC .......... *H01J 37/04* (2013.01); *H01J 37/3171* (2013.01); *H01J 2237/04* (2013.01)

(58) Field of Classification Search
CPC ..... H01J 37/04; H01J 37/3171; H01J 2237/04
See application file for complete search history.

(56) References Cited

U.S. PATENT DOCUMENTS

| | | | | |
|---|---|---|---|---|
| 11,270,439 B2 * | 3/2022 | Asadizanjani | .......... | G06T 7/11 |
| 2008/0245957 A1 | 10/2008 | Gupta | | |
| 2017/0357911 A1 | 12/2017 | Liu | | |
| 2021/0271172 A1 | 9/2021 | Luo | | |

| | | |
|---|---|---|
| 2022/0100935 A1 | 3/2022 | Chen |
| 2022/0276563 A1 | 9/2022 | Wang |
| 2022/0301817 A1 | 9/2022 | Takemura |
| 2022/0359157 A1 | 11/2022 | Welsh |
| 2022/0375051 A1 | 11/2022 | Brauer |

(Continued)

FOREIGN PATENT DOCUMENTS

| | | |
|---|---|---|
| JP | 2009099857 A | 5/2009 |
| KR | 1020170069137 A | 6/2017 |

OTHER PUBLICATIONS

International Search Report and Written Opinion for International Application No. PCT/US2024/047396, mailed on Dec. 20, 2024, 9 pages.

(Continued)

*Primary Examiner* — Sean Luck

(74) *Attorney, Agent, or Firm* — KDW Firm PLLC

(57) ABSTRACT

Techniques to dynamically tune components of an ion implanter are described. A method includes generating a first histogram for a first setting parameter of an ion implanter and a second histogram for a second setting parameter of the ion implanter. The histograms comprise a graphical representation of a distribution of data points across a range of values for each setting parameter. The method includes presenting the histograms on a user interface, receiving a control directive to modify a first range of values for the first setting parameter, predicting a modification to a second range of values for the second setting parameter based on the modification to the first range of values by a machine learning model, and presenting the second histogram for the second setting parameter to indicate the modification to the second range of values for the second setting parameter. Other embodiments are described and claimed.

20 Claims, 17 Drawing Sheets

HISTOGRAM 404

CONTROL PARAMETER 426

(56)    References Cited

U.S. PATENT DOCUMENTS

| | | |
|---|---|---|
| 2023/0013095 A1 | 1/2023 | Sprenkle |
| 2023/0016122 A1 | 1/2023 | Eidukonis |

OTHER PUBLICATIONS

Ancona, Marco, "Towards a better understanding of gradient-based attribution methods for Deep Neural Networks," http://arxiv.org/abs/1711.06104, Mar. 2018.

Lundberg, Scott et al, "A Unified Approach to Interpreting Model Predictions," http://arxiv.org/abs/1705.07874, 2017.

Bach, Sebastian et al, "On Pixel-Wise Explanations for Non-Linear Classifier Decisions by Layer-Wise Relevance Propagation," http://journals.plos.org/plosone/article?id=10.1371/journal.pone.0130140, 2015.

Simonyan, Karen et al, "Deep Inside Convolutional Networks: Visualising Image Classification Models and Saliency Maps," http://arxiv.org/abs/1312.6034, Apr. 19, 2014.

* cited by examiner

ION IMPLANTER 102

100

132

130

124

134

120

108

104

140

HISTOGRAM 802

Angle Metric A total samples

Available   Selected

GENERATE A FIRST HISTOGRAM FOR A FIRST SETTING PARAMETER OF AN ION IMPLANTER, THE FIRST HISTOGRAM COMPRISING A GRAPHICAL REPRESENTATION OF A DISTRIBUTION OF DATA POINTS ACROSS A FIRST RANGE OF VALUES ASSOCIATED WITH THE FIRST SETTING PARAMETER 902

GENERATE A SECOND HISTOGRAM FOR A SECOND SETTING PARAMETER OF THE ION IMPLANTER, THE SECOND HISTOGRAM COMPRISING A GRAPHICAL REPRESENTATION OF A DISTRIBUTION OF DATA POINTS ACROSS A SECOND RANGE OF VALUES ASSOCIATED WITH THE SECOND SETTING PARAMETER 904

PRESENT THE FIRST HISTOGRAM AND THE SECOND HISTOGRAM ON A GRAPHICAL USER INTERFACE (GUI) OF AN ELECTRONIC DEVICE 906

RECEIVE A CONTROL DIRECTIVE FROM THE GUI TO MODIFY THE FIRST RANGE OF VALUES ASSOCIATED WITH THE FIRST SETTING PARAMETER 908

PREDICT A MODIFICATION TO THE SECOND RANGE OF VALUES ASSOCIATED WITH THE SECOND SETTING PARAMETER BASED ON THE MODIFICATION TO THE FIRST RANGE OF VALUES ASSOCIATED WITH THE FIRST SETTING PARAMETER BY A MEAN PROCESS MODEL 910

PRESENT THE SECOND HISTOGRAM FOR THE SECOND SETTING PARAMETER ON THE GUI TO INDICATE THE MODIFICATION TO THE SECOND RANGE OF VALUES ASSOCIATED WITH THE SECOND SETTING PARAMETER 912

FIG. 9

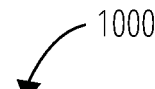

GENERATE A GRAPHICAL USER INTERFACE (GUI) COMPRISING A SET OF GUI ELEMENTS REPRESENTING MULTIPLE SETTING PARAMETERS FOR AN ION IMPLANTER, EACH SETTING PARAMETER REPRESENTED AS A HISTOGRAM COMPRISING A SET OF SAMPLES FOR THE SETTING PARAMETER, THE HISTOGRAM TO INCLUDE A MINIMUM SELECTOR ELEMENT TO SELECT A MINIMUM VALUE FOR THE SET OF SAMPLES AND A MAXIMUM SELECTOR ELEMENT TO SELECT A MAXIMUM VALUE FOR THE SET OF SAMPLES 1002

RECEIVE A CONTROL DIRECTIVE TO MODIFY A MINIMUM SELECTOR ELEMENT OR A MAXIMUM SELECTOR ELEMENT OF A FIRST HISTOGRAM FOR A FIRST SETTING PARAMETER OF THE MULTIPLE SETTING PARAMETERS, THE CONTROL DIRECTIVE TO SELECT A FIRST SUBSET OF SAMPLES FROM A FIRST SET OF SAMPLES FOR THE FIRST SETTING PARAMETER  1004

PREDICT A SECOND SUBSET OF SAMPLES FROM A SECOND SET OF SAMPLES FOR A SECOND SETTING PARAMETER OF THE MULTIPLE SETTING PARAMETERS BASED ON THE FIRST SUBSET OF SAMPLES BY A MEAN PROCESS MODEL, THE MEAN PROCESS MODEL COMPRISING AN ARTIFICIAL NEURAL NETWORK (ANN) 1006

MODIFY A MINIMUM SELECTOR OR A MAXIMUM SELECTOR OF A SECOND HISTOGRAM FOR THE SECOND SETTING PARAMETER TO SELECT THE SECOND SUBSET OF SAMPLES FROM THE SET OF SAMPLES FOR THE SECOND SETTING PARAMETER 1008

COMPUTER-READABLE STORAGE MEDIUM 1402

COMPUTER EXECUTABLE
INSTRUCTIONS 1404

DYNAMIC ION BEAM SHAPE SELECTION

BACKGROUND

An ion implanter is a device used in the semiconductor industry for doping or modifying the properties of materials. It is specifically designed to precisely introduce impurities, known as dopants, into target material to create semiconductor devices like transistors. The target material is usually a silicon wafer. The process involves accelerating ions to high speeds using an electric field and directing them towards the target material. The accelerated ions penetrate a substrate of the target material, displacing atoms and creating a controlled distribution of dopants in the substrate. The ion implanter typically comprises various components, such as an ion source to generate the desired ions, an accelerator to increase their energy, a mass analyzer to select the desired ions, and a beamline system to direct and focus the ion beam onto the substrate. The implanter settings, such as energy and current, are carefully controlled to achieve the desired dopant depth and concentration profiles. By precisely controlling the ion energy and dose, an ion implanter allows the customization of material properties. It plays a crucial role in the fabrication of integrated circuits, where different dopants create various regions necessary for device functionality, such as transistor gates, source, and drain regions. Overall, an ion implanter is a vital tool in the semiconductor industry for precisely introducing controlled impurities into materials, enabling the creation of advanced electronic devices.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

FIG. 9 illustrates a logic flow in accordance with one embodiment.

FIG. 10 illustrates a logic flow in accordance with one embodiment.

DETAILED DESCRIPTION

Figure 1:
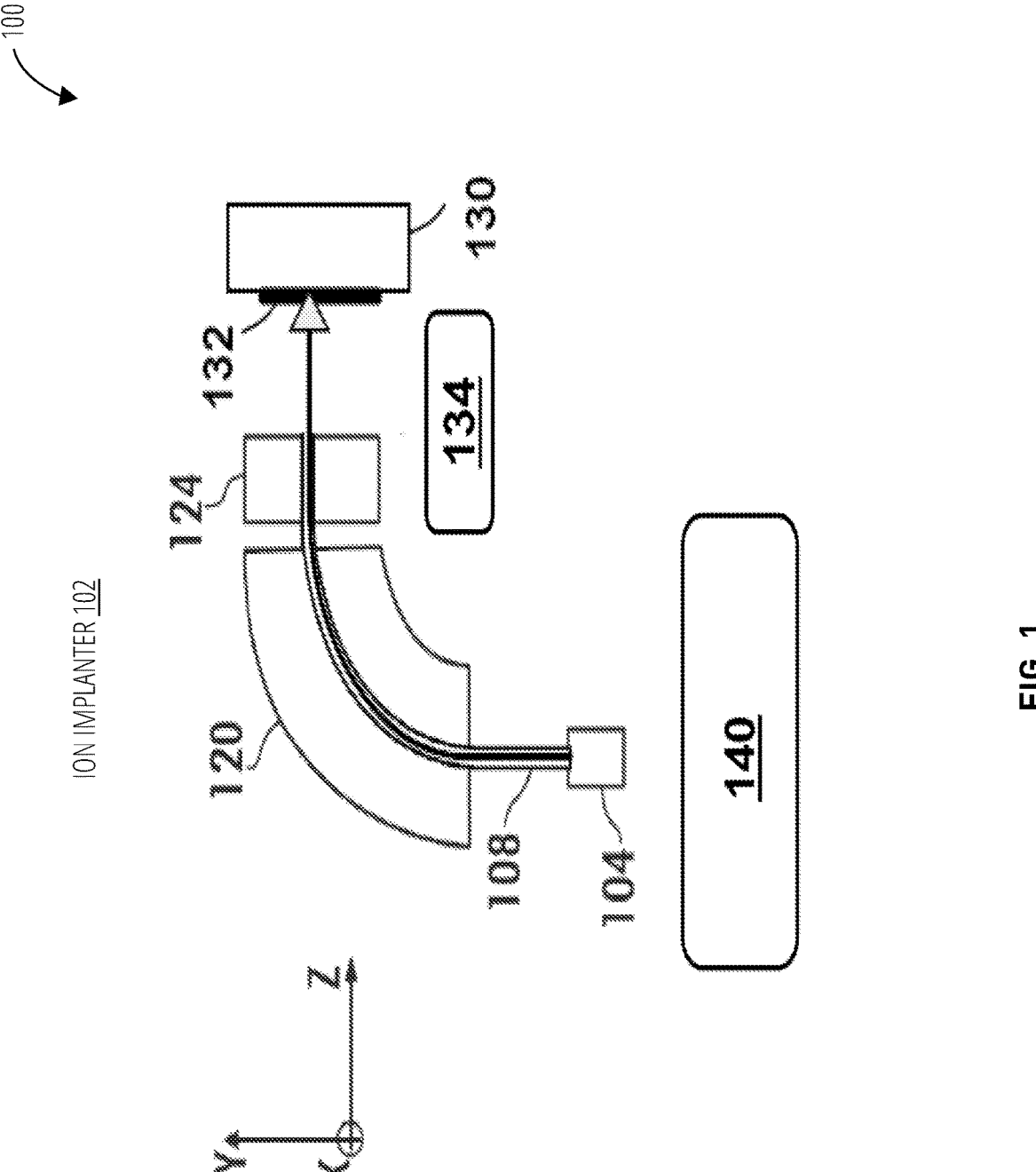
FIG. 1 illustrates an ion implanter in accordance with one embodiment.

Embodiments are generally directed to artificial intelligence (AI) and machine learning (ML) techniques for controlling a configuration or operation of an ion implanter. Some embodiments are particularly directed to AI and ML techniques to assist in automatically tuning one or more components of an ion implanter for directing, controlling and shaping an ion beam as it travels from an ion source to a target material, such as a silicon wafer.

In one embodiment, for example, the AI and ML techniques may assist in dynamic ion beam shape selection for an ion implanter system. A process metric sieve, using a forward model population generator, is input to an AI/ML "recipe" generator for an ion implanter. A neural net ML model is constructed and trained based on ion implanter control inputs augmented by certain metadata, such as tunability, stability, wear, preventative maintenance (PM) cycles, and other metadata. The constructed neural network is equally subsampled across the entire input domain and presented on a user interface as multiple histograms for all of the output metrics, including any metadata. The user interface presents certain histograms with minimum and maximum window selectors, where modification of any window limit dynamically updates the available subpopulation on all of the remaining histograms. This makes full tool beam metrology entitlement visible to the user while presenting only achievable combinations of metrics.

Embodiments implement a novel combination of an interactive user interface presenting recipe generation data in a visually-accessible manner while allowing real-time dynamic updates supported by a trained ML model. This combination allows a user to easily generate a specification at recipe development time using process parameters of interest, such as beam distribution angles (e.g., vertical within device angle (VWIDA), horizontal within device angle (HWIDA)), width, height, full height half maximum (FHHM), and others. In addition, once process specifications are defined, the histograms assist a user in targeting values and windows for all control inputs that control components of the ion implanter. This represents a significant departure from conventional heuristics, lookup functions and tables meant to guide basic recipe parameters to achieve maximum stable current. Further, embodiments leverage an all recipe metrology entitlement model which is subsampled in an interactive way by a user. As the user starts tightening certain process windows, the remaining process windows are live updated to show what remains as "achievable" along with the tune control windows that correspond to the selected options. In this way, recipe development exploits the full tool entitlement for process space. It can also be performed off-tool as it does not require tool time and experimentation to discover operating regions and set appropriate limits.

By way of background, ion implanters use a series of optical elements to extract ions, accelerate to precise energies, and form a stable uniform beam for implanting ions at specific depths in various substrates. These expensive machines must work over a wide range of ion mass and charge states, and manipulate the various optical elements to achieve a desired structure on a target material, such as a silicon wafer. As structures have become smaller and taller, operators need repeatable beam shapes with high uniformity, and that can achieve specific angle uniformity and distributions for exacting process requirements.

An operator for an ion implanter typically tunes various components of the ion implanter, sometimes referred to as "beamline" elements, by modifying one or more control parameters for the components to determine an effect on process parameters for the components. The components of an ion implanter shape a trajectory of an ion beam, focuses the ion beam, and ensures its stability and accuracy throughout the implantation process. Examples of components for the ion implanter may include electrostatic lenses, magnetic lenses, aperture systems, beam scanning systems, mass analyzers, Faraday cups, beam diagnostic tools, and other components.

Tuning an ion implanter is necessary for generating an ion beam with a set of target beam properties suitable for an intended application. Examples of tuning operations may include calibrating the ion implanter to ensure accurate measurements, adjusting a beam current to the desired level by changing the extraction voltage or aperture size, setting an appropriate ion energy to achieve the desired penetration depth in the target material by adjusting an accelerator voltage or a bias potential to control the ion energy to affect a depth of ion penetration and consequently the resulting doping profile, fine-tuning beam optics to ensure proper focusing and alignment by adjusting magnetic fields and beamline components to shape and direct the ion beam accurately onto the target area, attaining uniformity across the target area by adjusting the beam distribution for a beam scanning pattern or beam shaping devices, controlling a dose implanted by adjusting the beam current and the time of exposure to the ion beam, and other tuning operations. After tuning the ion implanter, a controller may conduct regular characterization tests to verify the achieved beam properties. This can involve metrology techniques such as secondary ion mass spectrometry (SIMS) or sheet resistance measurements.

An operator for an ion implanter typically tunes components of the ion implanter by modifying one or more control parameters for the components to determine an effect on one or more process parameters for the components. Each control parameter corresponds to a hardware or software setting for a component of the ion implanter. Examples of control parameters include without limitation a charge parameter, an energy parameter, an acceleration or deceleration parameter, a dopant and flow parameter, a diluent and flow parameter, a source parameter, an analyzer parameter, a corrector parameter, a suppression parameter, a focus parameter, a scan parameter, a quadrupole lens current parameter, a post-acceleration voltage parameter, and other control parameters. Each process parameter corresponds to a beam property for an ion beam generated by the ion implanter. Examples of process parameters include without limitation a beam height parameter, a beam width parameter, full height half maximum (FHHM) parameter, a vertical within device angle (VWIDA) parameter, a VWIDA mean (VWIDAM) parameter, a horizontal within device angle (HWIDA) parameter, a HWIDA mean (HWIDAM) parameter, a standard deviation of VWIDA (VWIDAS) parameter, a standard deviation of HWIDA mean (HWIDAS) parameter, a vacuum interface (VI) parameter, a width (full not half) parameter, a spotscore parameter, an energy parameter, a region of interest (ROI) current parameter, a uniformity parameter, and other process parameters.

Changing a control parameter for a component of the ion implanter affects a beam property of an ion beam as it implants ions into a substrate of a silicon wafer. This is typically a manually-intensive process, where the operator manually changes values for control parameters and evaluates changes in values for process properties important for a given application. This process continues in an iterative fashion until a particular configuration for the control parameters produces the desired output values for the process parameters. This is a typically a tedious and time-consuming task for the operator, particularly when there is a large number of control parameters and process parameters.

The beamline elements of an ion implanter system are generally tuned to deliver maximum ion beam current which translates into higher machine throughput. Since each beamline element typically has several settings, an ion implanter with multiple beamline elements can have numerous combinations of settings that have to be sequentially changed and evaluated. The sequential changing and evaluating of one beamline element at a time is effectively a blind search in a vast data universe and therefore is inefficient and very time consuming. Another limitation of this approach is that it does not consider other beam properties that relate to the quality of the ion beam such as angular distribution, beam density distribution and beam profile uniformity. For example, it may be desirable to tune an ion implanter to other beam properties in addition to or in place of beam current in order to provide a more stable region of ion implanter operation.

A software application has difficulty in characterizing a complete tool entitlement for beam current, beam shape and angle distribution. A user interface can list the possible upper and lower achievable limits for each different beam metric; however, it does not necessarily mean they can be reached in any combination. Conventionally, a user uses a software application to set up a particular recipe with desired species, dose and energy. Then, through a series of experiments and manual tuning, the user manually attempts to find an acceptable window for shape and angles. Due to the large search space defined by tuning many optical elements, however, global optima are easily missed and more suitable tuning regions with better process results may remain undiscovered.

Embodiments provide solutions for dynamically tuning an ion implanter system which overcomes the above-described inadequacies and shortcomings. Embodiments are generally directed to dynamic ion beam shape selection. Some embodiments are particularly directed to AI/ML techniques to quickly and efficiently tune beamline elements of an ion implanter system to generate an ion beam in accordance with an ion implantation recipe. The embodiments include techniques for presenting various setting parameters associated with various components of an ion implanter on a user interface, such as a GUI. The GUI is designed to allow an operator or a user to easily manipulate GUI elements to change or modify a range of values for a given setting parameter and instantly view changes in value ranges for other setting parameters affected by the change in the given setting parameter.

The changes in value ranges for the other setting parameters are predicted by a mean process model, such as an artificial neural network. The mean process model is designed to take as input the given setting parameter and associated values, and predict, suggest or infer a set of setting parameters affected by the input values, along with any changes to the value ranges for the set of setting parameters. The mean process model operates in real-time in an online or offline mode for the ion implanter. The mean process model is trained to operate at a speed that allows nearly instantaneous updates to the GUI to allow the operator or user to quickly assess the impact of various changes made to the setting parameters in real-time. This allows the operator to quickly generate and assess different recipes for different applications of the ion implanter.

In one embodiment, for example, a software application may comprise instructions suitable for execution by logic circuitry or processing circuitry. The software application is generally arranged to assist in tuning operations for an ion implanter. The software application includes a GUI to present multiple GUI elements representing various setting parameters for one or more beamline elements of an ion implanter. Examples of setting parameters may include without limitation control parameters, process parameters, qualifier parameters, and various custom "meta" parameters. A control parameter generally corresponds to a hardware or software setting that controls a particular configuration or operation of a component of the ion implanter. A process parameter generally corresponds to a beam property, or a metric associated with a beam property, for an ion beam generated by the ion implanter. A qualifier parameter may represent one or more performance indicators for components of the ion implanter. Examples of qualifier parameters include performance indicators such as tune time, stability, tunability, stress vector impact, wear time, and other performance indicators. A meta parameter is a custom indicator for components of the ion implanter, and it may be defined by a user of the ion implanter or an original equipment manufacturer (OEM) of the ion implanter. One example of a meta parameter may comprise a preventative maintenance (PM) phase cycle parameter. Embodiments are not limited to these particular examples.

The GUI may use various GUI elements to present a total population of data points for each setting parameter for an ion implanter in a form of a histogram. The histogram is a graphical representation of the distribution of data points across a range of values associated with each setting parameter. In one embodiment, the histogram comprises a series of bars or rectangles, where the width of each bar represents a specific range or "bin" of values, and the height of each bar represents the frequency or count of data points falling within that range. In another embodiment, the histogram comprises continuous values represented by lines and shaded areas. Histograms are commonly used to visualize the shape, spread, and skewness of continuous or discrete data sets. They are especially useful for understanding the frequency distribution and identifying patterns or outliers in the data.

Each histogram may include GUI elements to select a range of values for each setting parameter. For example, the histogram may include a minimum selector element to allow an operator to select a minimum value for the range of values and a maximum selector element to allow the operator to select a maximum value for the range of values. The operator may use the selector elements to modify the range of values, such as moving the selector elements to increase the range of values or decrease the range of values.

An operator may use the selector elements to modify a value range for a histogram associated with a setting parameter of interest to the operator. The software application implements a ML model trained to accept as input an initial setting parameter and a value range associated with the setting parameter as modified by the operator. The ML model makes a prediction or inference for modifications to value ranges for one or more of the remaining setting parameters affected by the modifications to the initial setting parameter. The GUI updates the histograms for the remaining setting parameters to reflect modifications to the value ranges associated with each of the affected setting parameters.

In various embodiments, the ML model may be implemented as an artificial neural network (ANN), such as a feed forward neural network model. Examples of ML models may include without limitation a mean process model to predict one setting parameter from another setting parameter, a control model to predict process parameters from control parameters, an inverted control model to predict control parameters from process parameters, a qualifier model to predict qualifier parameters for process parameters from control parameters, as well as other ML models. Embodiments are not limited to a particular ML model or type of ML model. Other ML models may be used as desired for a given implementation.

The GUI and underlying ML model to provide real-time updates to the GUI provide a significant technical advantage over conventional techniques. For example, the operator can easily move the selector elements to increase or decrease a range of values for a control parameter and in real-time the GUI updates histograms with new value ranges for any other setting parameters affected by the change in the range of values for the control parameter. In this manner, the GUI provides an easy visual reference to allow an operator to instantly perceive how changes to various control parameters impacts other setting parameters for the ion implanter. This significantly decreases an amount of time needed to manually and repetitively adjust control parameters in an attempt to arrive at a desired set of beam properties for a given application.

In one embodiment, for example, a GUI may present or display multiple histograms, where each histogram presents a distribution of data points for different values of a setting parameter. One or more histograms may include, for example, various GUI elements designed to allow a user to select or modify a range of values for the setting parameter, thereby highlighting or creating a visual overlay across the bins of the histogram containing the data points contained within the range of values for the setting parameter. For example, the histogram may include a minimum selector element and a maximum selector element. The minimum selector element controls selection of a minimum value for the range of values associated with the setting parameter. The maximum selector element controls selection of a maximum value for the range of values associated with the setting parameter. An operator or user may manipulate one or both of the minimum selector element and the maximum selector element to vary the range of values for a base histogram, such as increasing the range of values or decreasing the range of values. An event handler receives control directives from the GUI representing the selections by the operator, and it sends the control directives to the mean process model. The mean process model accepts as input the modified range of values for the base histogram, and it predicts modifications to other value ranges for other histograms associated with setting parameters affected by the modified range of values for the base histogram. The GUI may then be updated in real-time to present the other modified value ranges for the affected histograms.

In one embodiment, for example, a processing circuitry may generate a first histogram for a first setting parameter of an ion implanter, the first histogram to include a graphical representation of a distribution of data points across a first range of values associated with the first setting parameter. The processing circuitry may generate a second histogram for a second setting parameter of the ion implanter, the second histogram to include a graphical representation of a distribution of data points across a second range of values associated with the second setting parameter. The processing circuitry may present the first histogram and the second histogram on a user interface, such as a GUI, of an electronic device, such as a controller for the ion implanter. The processing circuitry may receive a control directive from the GUI to modify the first range of values associated with the first setting parameter. For example, a user may use a selection element of the GUI to modify a minimum or maximum value for the first range of values. The processing circuitry may predict a modification to the second range of values associated with the second setting parameter based on the modification to the first range of values associated with the first setting parameter by a mean process model. The mean process model may comprise, for example, an artificial neural network, such as a feed forward neural network. The processing circuitry may present the second histogram for the second setting parameter on the GUI to indicate the modification to the second range of values associated with the second setting parameter. For example, the GUI may modify a minimum or maximum value for the second range of values as predicted by the mean process model. In this way, a user may instantly view how modifications to one setting parameter affects other setting parameters for the ion implanter. Embodiments are not limited to this embodiment.

The use of AI and ML techniques for automatically tuning an ion implanter provides a significant technical solution that overcomes several technical challenges, including process repeatability, cross-tool process matching, decreased tune time, periodic maintenance endpoint detection, access to the full tool entitlement of beam shapes, and simplifying the customers' ability to quickly identify desired beam shape characteristics and establish appropriate tune window for reliable and repeatable tuning. Accordingly, tuning an ion implanter consumes less electronic resources, including: device resources such as compute and memory resources; device platform resources such as input/output (I/O) devices, peripheral components, and interfaces; network resources such as interconnect, wired and wireless bandwidth and associated protocol stack interfaces; cloud computing and data center resources; and other valuable and scarce computing and communications resources.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC and/or a user equipment (e.g., mobile phone, etc.) with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description or the claims, such terms are intended to be inclusive in a manner similar to the term "comprising." Additionally, in situations wherein one or more numbered items are discussed (e.g., a "first X", a "second X", etc.), in general the one or more numbered items may be distinct or they may be the same, although in some situations the context may indicate that they are distinct or that they are the same.

As used herein, the term "circuitry" may refer to, be part of, or include a circuit, an integrated circuit (IC), a monolithic IC, a discrete circuit, a hybrid integrated circuit (HIC), an Application Specific Integrated Circuit (ASIC), an electronic circuit, a logic circuit, a microcircuit, a hybrid circuit, a microchip, a chip, a chiplet, a chipset, a multi-chip module (MCM), a semiconductor die, a system on a chip (SoC), a processor (shared, dedicated, or group), a processor circuit, a processing circuit, or associated memory (shared, dedicated, or group) operably coupled to the circuitry that execute one or more software or firmware programs, a combinational logic circuit, or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

FIG. 1 depicts a schematic view of a system 100 including an ion implanter 102, in accordance with embodiments of the disclosure. The ion implanter 102 may include an ion source 104 for producing an ion beam 108, and a series of beam-line components. The ion source 104 may comprise a chamber for receiving a flow of gas and generating ions. The ion source 104 may also comprise a power source and an extraction electrode assembly (not shown) disposed near the chamber.

Suitable ions for ion beam 108 may include any ion species at a suitable ion energy, including ions such as phosphorous, boron, argon, indium, BF2, nitrogen, oxygen, hydrogen, inert gas ions, and metallic ions, according to some non-limiting embodiments, with ion energy being tailored according to the exact ion species used.

The beam-line components may include, for example, a mass analyzer 120, and an end station 130, to house and manipulate a substrate 132 that is to intercept the ion beam 108. Thus, the ion source 104, as well as additional beamline components, will provide the ion beam 108 to the substrate 132, having a suitable ion species, ion energy, beam size, and beam angle, among other features, for implanting ions into the substrate 132.

In FIG. 1, in addition to a mass analyzer, according to various non-limiting embodiments, additional components that lie downstream to the ion source 104 may be included. These additional components may include components to accelerate ion beam 108, decelerate ion beam 108, focus ion beam 108, steer ion beam 108, collimate ion beam 108, mass filter ion beam 108, and scan ion beam 108, among other operations. Examples of components to accelerate an ion beam 108 include a DC accelerator column, an RF linear accelerator, and a tandem accelerator, as known in the art. Examples of components to scan the ion beam 108 include an electrostatic scanner or a magnetic scanner. An example of a component to focus the ion beam 108 includes a quadrupole lens.

The ion implanter 102 may further include one or more measurement components, arranged at one or more locations along the beam-line, between ion source 104 and end station 130. For simplicity, these components are shown as beam measurement component 134. Examples of measurement component 134 include ion beam current measurement devices, ion beam angle measurement devices, ion beam energy measurement devices, and ion beam size measurement devices. In one example, the beam measurement component 134 may be a current detector such as a scanning detector, a closed loop current detector, and in particular a closed loop Faraday current detector (CLF), for monitoring beam current provided to the substrate 116. The beam measurement component may be disposed to intercept the ion beam 108 and may be configured to record beam current of the ion beam 108, either at a fixed position, or as a function of position. In some examples, the beam current of ion beam 108 may be measured for a region of interest (ROI), such as the region of the substrate 116.

The ion implanter 102 may also include a control system 140, which system may be included as part of ion implanter 102, to control operations such as adjustments to ion beam parameters. These parameters may include ion beam energy, ion beam size, ion beam current, ion beam angle, and so forth. In turn, the control system 140 may adjust and control these parameters by adjusting the operation of various components of the aforementioned beamline components of the ion implanter 140. The control system 140 may be included in the ion implanter 102 or may be coupled to the ion implanter 102 in order to implement the AI and ML techniques for automatically tuning one or more components of the ion implanter 102 as set forth in the embodiments to follow.

Figure 2:
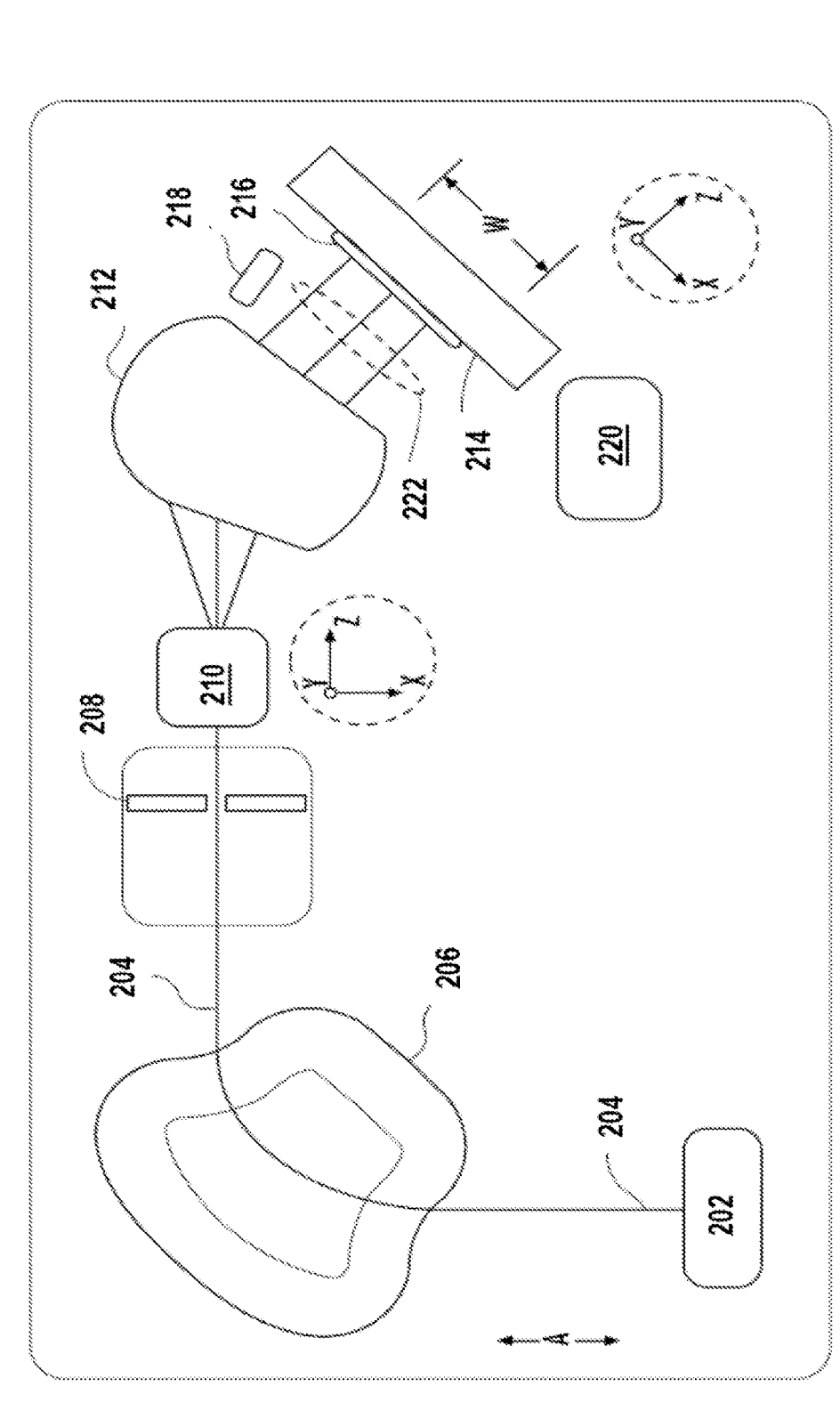
FIG. 2 illustrates an ion implanter in accordance with one embodiment.

FIG. 2 depicts an ion implanter system 200. The ion implanter system 200 depicts a block form of a beamline ion implanter in accordance with various additional embodiments of the disclosure. The ion implanter system 200 includes an ion source 202 configured to generate an ion beam 204. Suitable ions for ion beam 208 may include any ion species at a suitable ion energy, including ions such as phosphorous, boron, argon, indium, BF2, nitrogen, oxygen, hydrogen, inert gas ions, and metallic ions, according to some non-limiting embodiments, with ion energy being tailored according to the exact ion species used.

The ion beam 204 may be provided as a spot beam scanned along a direction, such as the X-direction. In the convention used herein, the Z-direction refers to a direction of an axis parallel to the central ray trajectory of an ion beam 204. Thus, the absolute direction of the Z-direction, as well as the X-direction, where the X-direction is perpendicular to the Z-direction, may vary at different points within the ion implanter system 200 as shown. The ion beam 204 may travel through a mass analysis component, shown as analyzer magnet 206, thence through a mass resolving slit 208, and through a collimator 212 before impacting a substrate 216 disposed on a substrate stage 214, which stage may reside within an end station (not separately shown). The substrate stage 214 may be configured to scan the substrate 216 at least along the Y-direction in some embodiments. In some embodiments, the substrate stage 214 may be configured to tilt about the X-axis or Y-axis, so as to change the beam angle of ion beam 204 when impacting substrate 216.

In the example shown in FIG. 2, the ion implanter system 200 includes a beam scanner 210. When the ion beam 204 is provided as a spot beam, the beam scanner 210 may scan the ion beam 204 along the X-direction, producing a scanned ion beam, that enters the collimator 212 and exits in a fashion such that the ion beam 204 impacts the substrate 216 as a scanned ion beam 222 that scanned at the substrate along the X-direction (note the local X-direction in absolute sense may differ at different locations along the beamline as shown). Generally, the ion beam 208 may be scanned back and forth across a substrate 216 for any suitable number of scans, with an accompanying scanning of the substrate 216 in an orthogonal direction to the beam scan direction, until the targeted dose is implanted into substrate 216. The width of the resulting scanned spot beam may be comparable to the width W of the substrate 216 In various embodiments, the ion beam 208 may be scanned at a frequency of several Hz, 10 Hz, 100 Hz, up to several thousand Hz, or greater.

In various non-limiting embodiments, the ion implanter system 200 may be configured to deliver ion beams for "low" energy or "medium" energy ion implantation, such as a voltage range of 1 kV to 300 kV, corresponding to an implant energy range of 1 keV to 300 keV for singly charged ions. As discussed below, the scanning of an ion beam provided to the substrate 116 may be adjusted depending upon calibration measurements before substrate ion implantation using a scanned ion beam. In other embodiments, the ion implanter 200 may be provided with an acceleration component, such as a DC acceleration column, an RF linear accelerator, or a tandem accelerator, where the ion implanter is capable to accelerate the ion beam 208 to energy of 1 MeV, 3 MeV, 5 MeV, or higher energy.

The ion implanter system 200 may further include one or more measurement components, arranged at one or more locations along the beam-line, between ion source 202 and substrate stage 214. For simplicity, these components are shown as beam measurement component 218. Examples of measurement component 218 include ion beam current measurement devices, ion beam angle measurement devices, ion beam energy measurement devices, and ion beam size measurement devices. In one example, the beam measurement component 218 may be a current detector such as a scanning detector, a closed loop current detector, and in particular a closed loop Faraday current detector (CLF), for monitoring beam current provided to the substrate 216. The beam measurement component may be disposed to intercept the ion beam 204 and may be configured to record beam current of the ion beam 204, either at a fixed position, or as a function of position. In some examples, the beam current of ion beam 204 may be measured for a region of interest (ROI), such as the region of the substrate 216.

The ion implanter system 200 may also include a control system 220, which may be included as part of ion implanter system 200, to control operations such as adjustments to ion beam parameters. These parameters may include ion beam energy, ion beam size, ion beam current, ion beam angle, and so forth. In turn, the control system 220 may adjust and control these parameters by adjusting the operation of various components of the aforementioned beamline components of the ion implanter system 200. The control system 220 may be included in the ion implanter system 200 or may be coupled to the ion implanter system 200 in order to implement the AI and ML techniques for automatically tuning one or more components of the ion implanter system 200 as set forth in the embodiments to follow.

Figure 3:
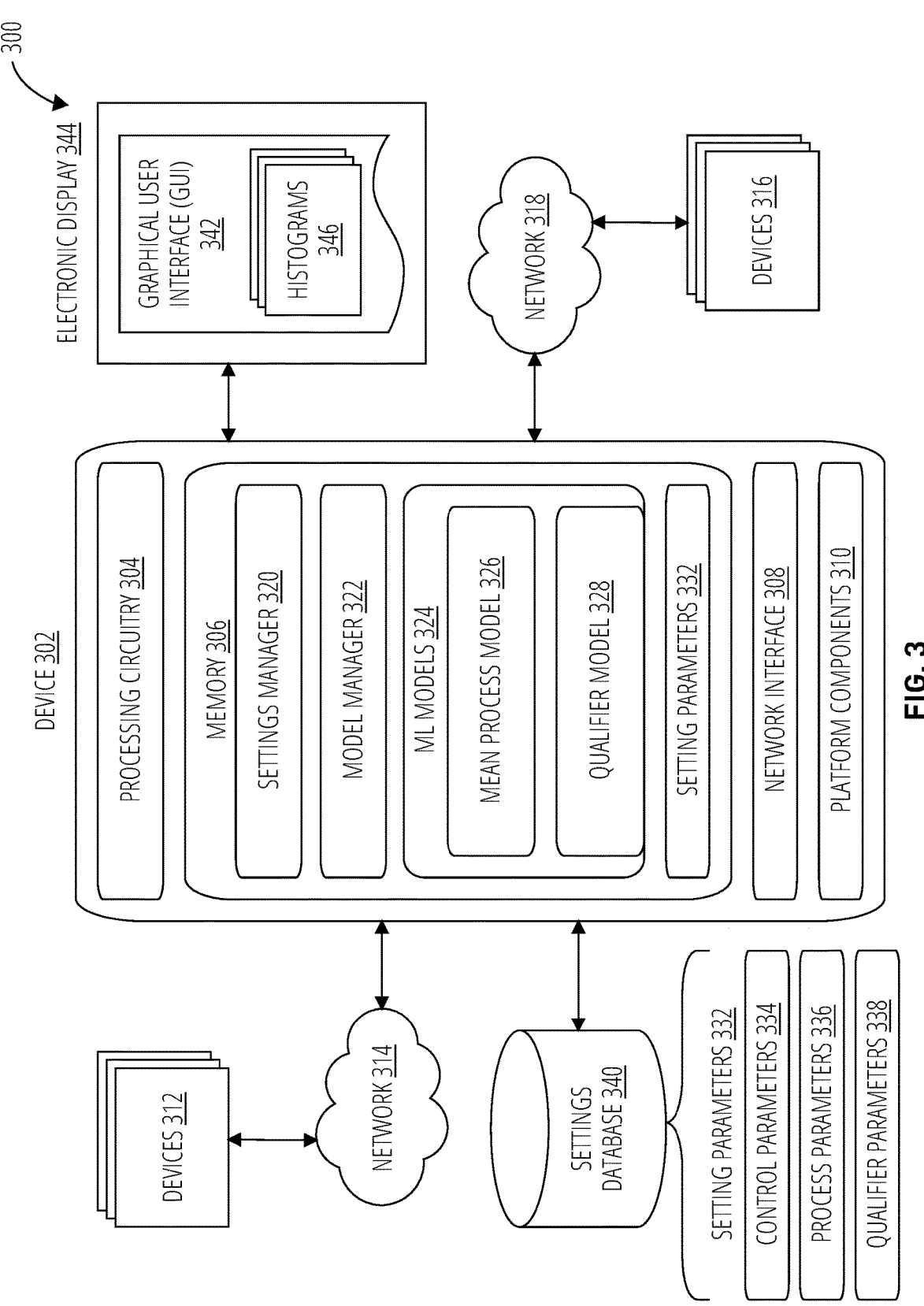
FIG. 3 illustrates an inferencing system in accordance with one embodiment.

FIG. 3 illustrates an embodiment of an inferencing system 300. The inferencing system 300 may be suitable for implementing one or more embodiments as described herein. In one embodiment, for example, the inferencing system 300 may implement a mean process model 326 that is trained using a set of training data. The mean process model 326 is designed to predict, suggest or infer changes in value ranges for one or more setting parameters 332 in response to a set of input values. The input values may represent changes made by a user to one of the setting parameters 332. The setting parameters 332 may comprise any parameters associated with a component of the ion implanter 102, such as one or more beamline components, for example, Examples of setting parameters 332 may include without limitation control parameters 334, process parameters 336, and/or qualifier parameters 338 associated with the ion implanter 102 or the ion implanter system 200. A training system suitable for training a mean process model 326 is described with reference to FIG. 11.

As depicted in FIG. 3, the inferencing system 300 may comprise a device 302 communicatively coupled to a set of devices 312 via a network 314. The device 302 may also be communicatively coupled to a set of devices 316 via a network 318. It may be appreciated that the inferencing system 300 may have more or less devices than shown in FIG. 3 with a different network topology as needed for a given implementation. Embodiments are not limited in this context.

Figure 15:
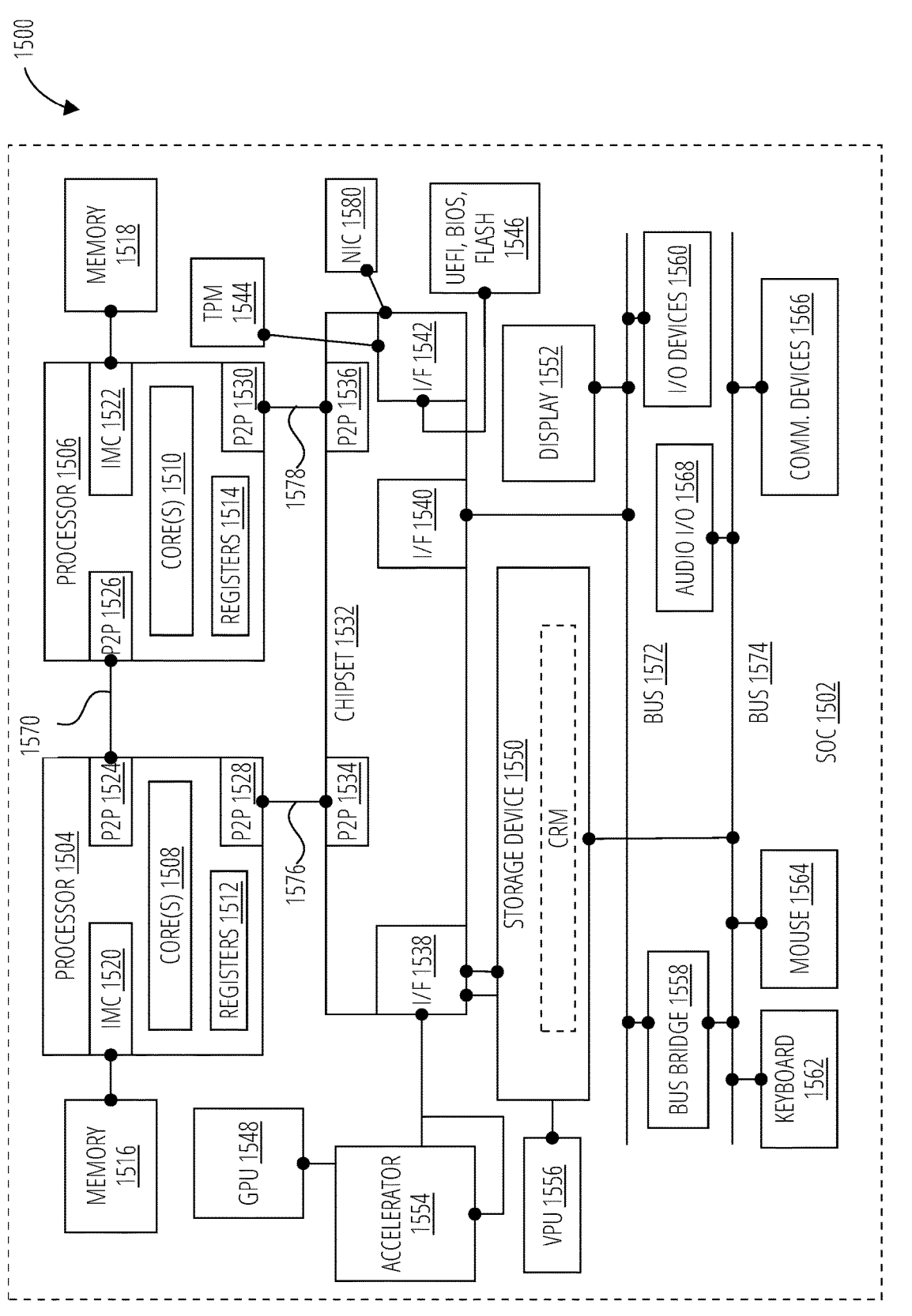
FIG. 15 illustrates a computing system in accordance with one embodiment.

In various embodiments, the device 302 may comprise various hardware elements, such as a processing circuitry 304, a memory 306, a network interface 308, and a set of platform components 310. Similarly, the devices 312 and/or the devices 316 may include similar hardware elements as those depicted for the device 302. The device 302, devices 312, and devices 316, and associated hardware elements, are described in more detail with reference to a computing architecture 1500 as depicted in FIG. 15.

In various embodiments, the devices 302, 312 and/or 316 may communicate control, data and/or content information associated with the ion implanter 102 via one or both network 314, network 318. The network 314 and the network 318, and associated hardware elements, may be implemented in accordance with a given wireless or wired communications architecture, such as a gigabit ethernet wired network, an IEEE 802.11 ("WiFi") wireless network, or a 3GPP 5G or 6G wireless network, among other types of networks.

The memory 306 may comprise a set of computer executable instructions that when executed by the processing circuitry 304, causes the processing circuitry 304 to manage a configuration or operation of the ion implanter 102. As depicted in FIG. 3, for example, the memory 306 may comprise a settings manager 320, a model manager 322, a set of ML models 324, and a set of setting parameters 332, among other parts. The ML models 324 include a mean process model 326 and a qualifier model 328. The setting parameters 332 include one or more control parameters 334, process parameters 336, and qualifier parameters 338. Additionally or alternatively, the setting parameters 332 are stored in a settings database 340 accessible by the device 302. Although FIG. 3 depicts the inferencing system 300 depicted as software elements executing on hardware elements, it may be appreciated that the software elements may be implemented as hardware elements or a combination of software elements and hardware elements as needed for a given set of design constraints. Embodiments are not limited in this context.

The settings manager 320 generally manages setting parameters 332 associated with one or more components of the ion implanter 102. The settings manager 320 may perform one or more change, read, update or delete (CRUD) operations to manage the setting parameters 332 stored in the settings database 340 or the memory 306. The settings manager 320 may also read setting parameters 332 from a data source, such as components of the ion implanter 102 or input data from the GUI 342 of the electronic display 344. The settings manager 320 may also write setting parameters 332 to a data sink, such as components of the ion implanter 102 or as output data for presentation on the GUI 342 of the electronic display 344. Read operations may be useful for retrieving a current set of setting parameters 332 from components of the ion implanter 102 or the GUI 342 for updating by one or more of the ML models 324. Write operations may be useful for sending an updated set of setting parameters 332 from the ML models 324 to components of the ion implanter 102 or the GUI 342. The read and write operations may facilitate automated calibration and tuning of the components of the ion implanter 102, such as during normal preventative maintenance (PM) cycles, responsive to lower production yields, or emergency disruptions. The read and write operations may also facilitate design and testing of the components of the ion implanter 102, such as for new applications.

The settings manager 320 may generate a set of histograms 346 for presentation by the GUI 342 on the electronic display 344. The GUI 342 populates a screen of histograms 346 of varying sizes, with each of the histograms 346 including selector windows (e.g., with min/max limits). The histograms 346 may display full population in background gray, and selected subset in a highlighted color. In one embodiment, a matching count of all vectors that pass histogram filtering is displayed along with top 10 displayed in a grid format based on scoring middle of metric, middle of control, and highest on qualifiers. Evenly space control exploration spacing results in a metric spacing that infers areas of high and low metric achievability. Examples of the GUI 342 with histograms 346 are further described with reference to FIG. 4 through FIG. 8C.

The model manager 322 generally manages various operations for one or more ML models 324. The ML models 324 have access to various setting parameters 332, including control parameters 334, process parameters 336, and qualifier parameters 338. The setting parameters 332 are stored in the memory 306 or in the settings database 340. In one embodiment, the ML models 324 present the control parameters 334, the process parameters 336 and/or the qualifier parameters 338 on the GUI 342 of an electronic display 344.

An operator for the ion implanter 102 typically tunes components of the ion implanter 102 by modifying one or more control parameters 334 for the components to determine an effect on one or more process parameters 336 for the components. Each of the control parameters 334 corresponds to a hardware or software setting for a component of the ion implanter 102. Examples of control parameters 334 include without limitation a charge parameter, an energy parameter, an acceleration or deceleration parameter, a dopant and flow parameter, a diluent and flow parameter, a source parameter, an analyzer parameter, a corrector parameter, a suppression parameter, a focus parameter, a scan parameter, a quadrupole lens current parameter, a post-acceleration voltage parameter, and other control parameters. Embodiments are not limited to these examples.

Changing one or more control parameters 334 for one or more components of the ion implanter 102 affects a beam property of an ion beam as it implants ions into a substrate of a silicon wafer. In conventional systems, this is typically a manually-intensive process, where the operator manually changes values for control parameters 334 and evaluates changes in values for process parameters 336 important for a given application. This process continues in an iterative fashion until a particular configuration for the control parameters 334 produces the desired output values for the process parameters 336.

Embodiments automate tuning operations for the ion implanter 102 using one or more ML models 324 to avoid or reduce manual adjustments required by conventional systems. In general, a machine learning model is a mathematical representation or algorithmic structure that learns patterns and relationships from data in order to make predictions or take decisions without being explicitly programmed. It is a key component of machine learning, which is a subfield of artificial intelligence. A machine learning model is trained on a dataset containing input data and corresponding output labels or target values. During the training process, the model iteratively adjusts its internal parameters and learns from the data, aiming to minimize the difference between its predictions and the true values. Once trained, the model can be used to make predictions or decisions on new, unseen data. It takes the learned patterns and applies them to the input data to generate output predictions or estimates.

There are various types of machine learning models, each suited to different types of tasks and problem domains. Some common categories of machine learning models include: (1) regression models used to predict continuous numerical values, such as housing prices or stock prices; (2) classification models to classify inputs into different classes or categories based on their features, such as image classification or email spam filtering; (3) clustering models to group similar instances in an unsupervised manner, without prior knowledge of the classes or categories; (4) neural networks comprising interconnected nodes (or neurons) organized into layers, with each node applying functions to the data it receives; and (5) decision trees to represent decisions and their possible consequences as a tree-like structure and are commonly used for classification and regression tasks. These are just a few examples, and there are many other types and variations of machine learning models, each designed to tackle different types of problems and data structures.

As depicted in FIG. 3, the ML models 324 include a mean process model 326. In one embodiment, for example, the mean process model 326 is implemented as a feedforward model. A feedforward model is a type of neural network architecture where information flows through the network in one direction, from the input layer to the output layer, without any loops or cycles. It is called "feedforward" because the data passes through the network sequentially, layer by layer, without any feedback connections. In a feedforward model, the input data is fed into the input layer, and then it propagates forward through one or more hidden layers, where the data is transformed and processed. Finally, the transformed data is outputted by the output layer. Each layer is composed of multiple nodes (also called neurons) that perform calculations on the input data and apply linear or non-linear activation functions. The main purpose of a feedforward model is to map the input data to the desired outputs by learning the appropriate set of weights and biases associated with each node in the network. This learning process is typically accomplished through techniques such as backpropagation, where the model adjusts its parameters based on the difference between its predicted outputs and the ground truth labels. feedforward models are commonly used in various machine learning tasks, including classification, regression, and pattern recognition.

In one embodiment, the mean process model 326 is implemented as a control model, such as a feedforward model trained to receive an input control vector and predict an output process vector. An input control vector comprises an ordered list of values representing a set of control parameters 334 for the ion implanter 102. Each element of the input control vector corresponds to a specific value for each of the control parameters 334. The output process vector comprises an ordered list of values representing a set of process parameters 336 for the ion implanter 102 corresponding to the control parameters 334. Each element of the output process vector corresponds to a specific value for each of the process parameters 336.

In one embodiment, the mean process model 326 is implemented as an inverted control model 330. The inverted control model 330 is designed to invert the input-output pairs of the control model 326. In one embodiment, for example, the inverted control model 330 is a feedforward model that inverts operations for the control model 326. More particularly, the inverted control model 330 is a feedforward model trained to receive an input process vector and predict an output control vector. An input process vector comprises an ordered list of values representing a set of process parameters 336 for the ion implanter 102. Each element of the input process vector corresponds to a specific value for each of the process parameters 336. The output control vector comprises an ordered list of values representing a set of control parameters 334 for the ion implanter 102 corresponding to the process parameters 336. Each element of the output control vector corresponds to a specific value for each of the control parameters 334. The output control vector represents control parameters 334 that when implemented by one or more components of the ion implanter 102 causes the ion implanter 102 to generate an ion beam with beam properties that match the process parameters 336.

In one embodiment, the mean process model 326 may optionally include a qualifier model 328. In one embodiment, for example, the qualifier model 328 is a feedforward model similar to the mean process model 326. As with the mean process model 326, the qualifier model 328 is a feedforward model trained to receive an input control vector and predict an output process vector. Similar to the mean process model 326, the input control vector comprises an ordered list of values representing a set of control parameters 334 for the ion implanter 102. Unlike the mean process model 326, however, the output process vector comprises an ordered list of values representing one or more qualifier parameters 338 associated with the set of process parameters 336 that are output from the mean process model 326.

In one embodiment, the ML models 324 may generate arrays, vectors or embeddings having a particular format. An example of a suitable format may comprise: {[Control inputs (focus, extraction . . . )], [Beam Metrics (width, height . . . )], [Qualifiers (high wear . . . )], [PM phase]}. Other formats may be used as well.

The mean process model 326 and/or the qualifier model 328 may comprise forward models trained to exploit across multiple types of models. The mean process model 326 may be implemented as a control parameter to process parameter model, a control parameter to qualifier parameter model, a population to PM phase parameter model, a population to tool type model, and other combinations of inputs and predicted outputs based on the inputs. Embodiments may add multiple tools of same model or different tool models. The ML models 324 may be factory generated, fab generated, fab updated, or any combination of these. Embodiments could include multiple tool types, so that a process engineer could identify compatible process specifications across tools. The feed forward models can generate histograms in seconds, where millions of points can be generated over tight grid sampling of all control inputs. Stress models that impact achievable metrics at different phases of the post PM operation can be used to either pick fixed metrics that can be maintained over the whole PM space, or update throughput modeling by considering a current location in PM space.

Although the device 302 includes a separate mean process model 326 and qualifier model 328, it may be appreciated that the mean process model 326 and the qualifier model 328 can be combined into a single feedforward model. This is a design consideration based on expected performance of separate models versus a blended model. In one embodiment, the mean process model 326 comprises a regression neural network that includes one input layer, one or more hidden layers, and an output layer, where each neuron in the one or more hidden layers performs computations on input data using a linear activation function to generate a continuous output value, the linear activation function includes a rectified linear unit (ReLU) function, a leaky ReLU function, or a parametric ReLU function. An example regression neural network for the inverted control model 330 is described in more detail with reference to FIG. 13.

In general operation, the mean process model 326 is trained to map control parameters to process parameters 336. The mean process model 326 is optionally augmented with virtual metrology or signals, such as one or more qualifier parameters 338. The model manager 322 subsamples the mean process model 326 via an equidistant grid for a set of baseline parameters, such as species, AMU, charge, implant current as inferred by dose and step/pass choices, energy, and other parameters. The settings manager 320 generates the GUI 342 to display control parameters 334, process parameters 336, and qualifier parameters 338, where each parameter is represented by one or more histograms 346 over the grid space of the GUI 342. The histograms 346 each present data points as a total population of data points, a sample from the total population of data points, or subsamples from the samples. The data points may range from thousands to millions of data points depending on a particular type of ion implanter 102 or ion implanter system 200.

The settings manager 320 initializes a slider that bounds value ranges for each histogram, and it registers an event handler to monitor and detect any changes to the slider. A user may manipulate the slider to control a value range presented by a given histogram. Additionally or alternatively, the settings manager 320 may automatically changes the slider to control a value range presented by a given histogram. When a slider changes, the settings manager 320 updates the GUI 342 as a filter to the grid space, and it shows the remaining filter points as an overlay for each affected histogram. This process may continue until an acceptable set of values are discovered by the user or the settings manager 320. At this point, the GUI 342 may surface a control button to accept the final configuration of values to lock in the bounding limits into the final recipe. For a full automation mode, the user may select a default configuration value to allow the settings manager 320 to automatically iterate through all permutations of values for all setting parameters to arrive a final recipe without any human intervention.

In one embodiment, the settings manager 320 may configure a component of the ion implanter 102 based on a final recipe as defined by the setting parameters 332. For example, the settings manager 320 can present the setting parameters 332 on the GUI 342 for review and approval by an operator. The operator can select a GUI element representing approval of the proposed setting parameters 332. The GUI 342 generates a control directive and sends it to the settings manager 320. The settings manager 320 then automatically configures the appropriate components with the approved setting parameters 332. Alternatively, the settings manager 320 may be configured to automatically update the appropriate components with the proposed setting parameters 332 without explicit approval. Embodiments are not limited in this context.

In one embodiment, the settings manager 320 may write the setting parameters 332 to memory for software controllers of components of the ion implanter 102 or send control signals to hardware controllers for the components of the ion implanter 102. The ion implanter 102 may generate an ion beam based on the configured setting parameters 332.

Figure 4:
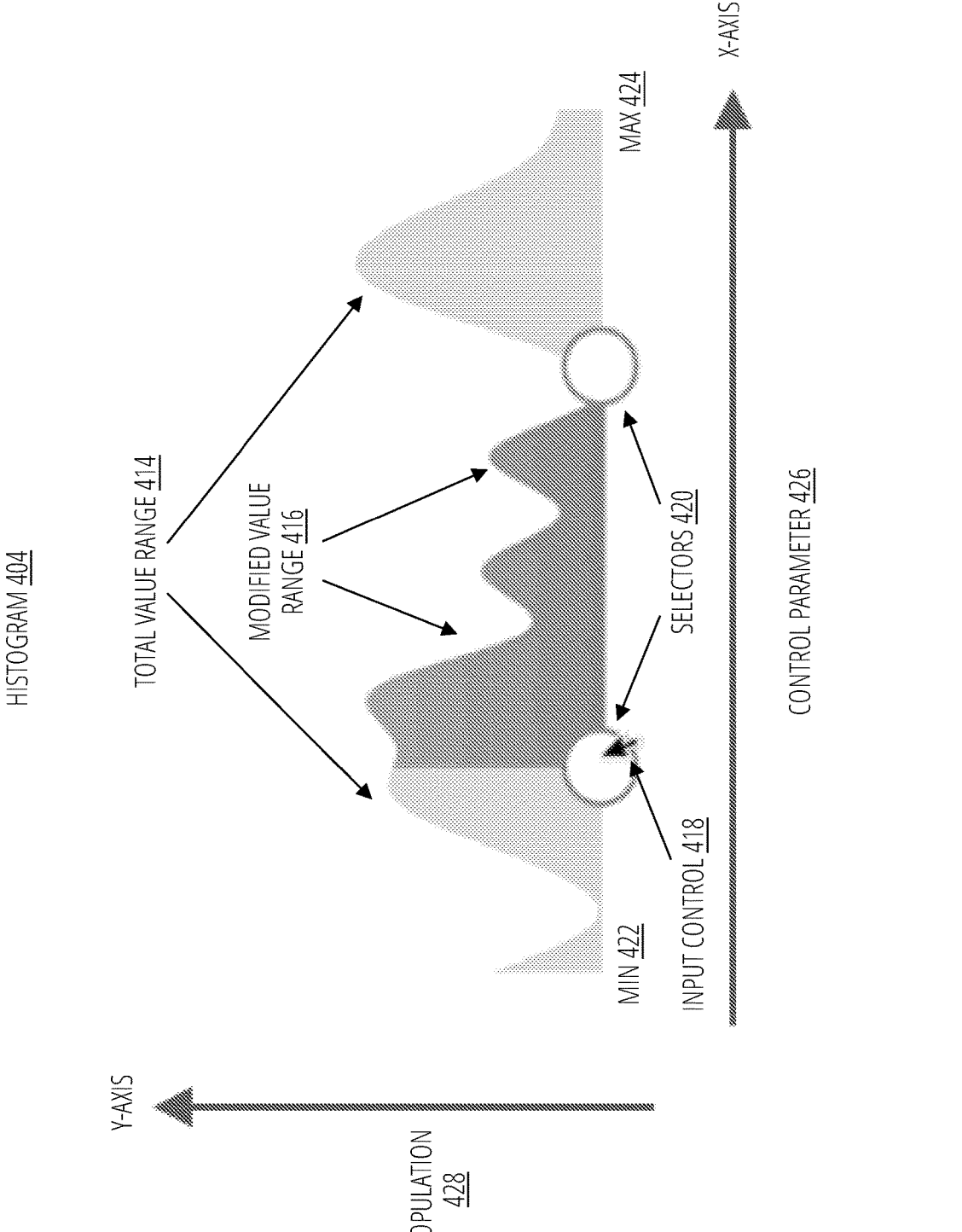
FIG. 4 illustrates a view of a graphical user interface (GUI) in accordance with one embodiment.

FIG. 4 illustrates an example implementation for the GUI 342. As discussed with reference to FIG. 3, the inferencing system 300 may be implemented by an electronic device 302 having an electronic display 344. The electronic display 344 may render or present a GUI 342.

The GUI 342 may display full tool entitlement in a way that preserves the interrelated limitations of the beam metrics, and adds additional criteria for tunability, stability, tool wear, and other beam related metadata. The GUI 342 relies upon rapidly generating millions of equally spaced samples using an AI/ML model restricted by energy, species, dose, and/or current. These data points are plotted as histograms of control inputs, predicted metrics, and predicted metadata such as tuneablity, stability, and wear on the tool. Each histogram has a lower and upper limit slider selector that the user can adjust during their recipe definition phase. Any change to any slider results in an instantaneous update to the other histograms showing what is available given the constraints of all displayed histograms. As a result, recipe development can exploit the full tool entitlement for a given process space. Furthermore, recipe development can also be done on or off tool as it does not require tool time and experimentation to discover different operating regions and set appropriate limits.

The GUI 342 is designed to present one or more GUI views that can be quickly restricted by both metrics and the control input targets and windows needed to tune repeatably to the desired optimum values to meet all constraints. The metrics may include virtual or meta metrics such as tunability, stability, tool stress, and achievability over entire PM cycle. Embodiments leverage a deep neural network to capture an entire tool operational window, and optionally add in stability, tunability and/or wear metrics, then do a fine resolution sampling over a data universe comprising millions of data points. These data points are presented such that every input and metric is given their own display control featuring a user selectable minimum and maximum slider and several histogram overlays.

The user can readily view tool entitlement, and as they start restricting metrics to desired values, the entire population of values is quickly filtered and each control gets a revised subset of filtered points, displayed as a smaller histogram overlay to the overall population model. When done selecting the desired metrics, the histograms of control inputs can be inspected. Each control input histogram would have a normal distribution of points, which could then be used to set target/min/max on each tuning control. If there are more than one normal distributions in the histogram, these represent duplicate tuning solutions. In this case the user could put more constraints on the virtual or meta metrics (e.g., stability, tunability, etc.) to remove duplicates. Another key advantage to this approach is the ability to do all the recipe configuration and setup without being on tool.

The GUI 342 presents various GUI elements representing a process metric sieve using a forward model population generator. The process metric sieve is implemented by a sieve algorithm for filtering or selecting specific elements from a larger set of data. A user may manipulate GUI elements associated with various parameters for an ion implanter, such as control parameters, process parameters, quality parameters, metadata parameters, preventative maintenance (PM) phase parameters, and so forth. The GUI 342 outputs a set of control signals corresponding to the user selections.

The GUI 342 receives the population values for each output metric, and it generates GUI elements representing a set of histograms for all of the output metrics, including any metadata. Each histogram presents an entire population for each of the output metrics. The GUI 342 also presents GUI elements to modify the histograms, such as control elements representing minimum (min) and maximum (max) window selectors for each of the histograms. A user may use an input device (e.g., a touchscreen, a keyboard, a mouse, voice commands, etc.) to manipulate the min/max window selectors for a given histogram. The GUI 342 generates another set of control signals representing modifications to the histogram, which are output to the AI/ML model. The AI/ML model then generates or predicts an available subpopulation for all of the unmodified histograms, and it outputs this information to the GUI 342. The GUI 342 then presents modified versions of the histograms depicting the available subpopulation on all of the remaining histograms.

As depicted in FIG. 4, the GUI 342 may use various GUI elements to present a total population 428 of data points for a setting parameter for the ion implanter 102 in a form of a histogram 404. The histogram 404 is a graphical representation of the distribution of data points across a range of values associated with a setting parameter of the setting parameters 332, such as a control parameter 426 of the control parameters 334, for example. The histogram 404 comprises a series of bars or rectangles, where the width of each bar represents a specific range or "bin" of values, and the height of each bar represents the frequency or count of data points falling within that range. Histograms are commonly used to visualize the shape, spread, and skewness of continuous or discrete data sets. They are especially useful for understanding the frequency distribution and identifying patterns or outliers in the data.

The histogram 404 depicts a total population 428 of data points along a y-axis and a total value range 414 along an x-axis. The total value range 414 may represent a range of possible values for the control parameter 426. The total value range 414 may include a min 422 and a max 424 for the total value range 414. The histogram 404 also depicts selectors 420, which may include a minimum selector element and a maximum selector element. The selectors 420 define boundaries for a modified value range 416. The modified value range 416 may comprise a subset of values from a set of values defined by the total value range 414.

An operator may move one or both selectors 420 to increase or decrease the boundaries for the modified value range 416. The GUI 342 receives a control directive representing values for the modified value range 416, and an event handler for the GUI 342 may output the modified value range 416 to the mean process model 326 and/or the qualifier model 328. The mean process model 326 and/or the qualifier model 328 may receive the modified value range 416 for the control parameter 426, and predict whether any other setting parameters 332 represented by other histograms are impacted by the modified value range 416 for the control parameter 426. The mean process model 326 and/or the qualifier model 328 also predict modified value ranges for the affected setting parameters 332. Examples for possible affected setting parameters 332 may include one or more of control parameters 334, process parameters 336, qualifier parameters 338, and/or meta parameters.

The settings manager 320 sends the other setting parameters 332 and modified value ranges for the other setting parameters 332 to the GUI 342. The GUI 342 updates the histograms for the other setting parameters 332 to reflect the modified value ranges predicted by the AI/ML models.

Figure 5:
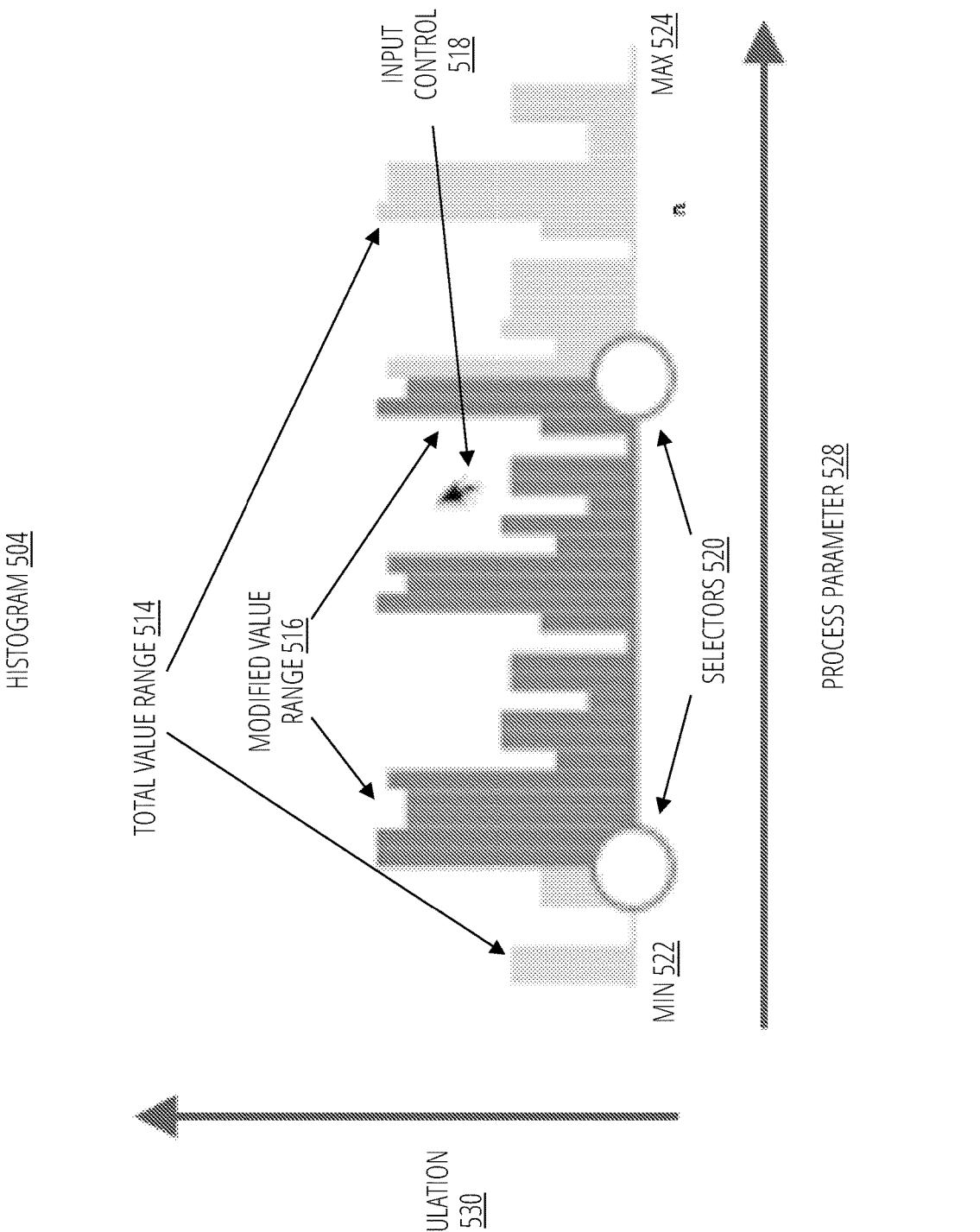
FIG. 5 illustrates a view of a GUI in accordance with one embodiment.

FIG. 5 illustrates another example implementation for the GUI 342. As discussed with reference to FIG. 3, the inferencing system 300 may be implemented by an electronic device 302 having an electronic display 344. The electronic display 344 may render or present a GUI 342.

As depicted in FIG. 5, the GUI 342 may use various GUI elements to present a total population 530 of data points for a setting parameter for the ion implanter 102 in a form of a histogram 504. The histogram 504 is a graphical representation of the distribution of data points across a range of values associated with a setting parameter of the setting parameters 332, such as a process parameter 528 of the process parameters 336, for example. The histogram 504 comprises a series of bars or rectangles, where the width of each bar represents a specific range or "bin" of values, and the height of each bar represents the frequency or count of data points falling within that range.

Similar to the histogram 404, the histogram 504 depicts a total population 530 of data points along a y-axis and a total value range 514 along an x-axis. The total value range 514 may represent a range of possible values for the process parameter 528. The total value range 514 may include a min

522 and a max 524 for the total value range 514. The histogram 504 also depicts selectors 520, which may include a minimum selector element and a maximum selector element. The selectors 520 define boundaries for a modified value range 516. The modified value range 516 may comprise a subset of values from a set of values defined by the total value range 514.

An operator may move one or both selectors 520 to increase or decrease the boundaries for the modified value range 516. The GUI 342 receives a control directive representing values for the modified value range 516, and an event handler for the GUI 342 may output the modified value range 516 to the mean process model 326 and/or the qualifier model 328. The mean process model 326 and/or the qualifier model 328 may receive the modified value range 516 for the process parameter 528, and predict whether any other setting parameters 332 represented by other histograms are impacted by the modified value range 516 for the process parameter 528. The mean process model 326 and/or the qualifier model 328 also predict modified value ranges for the affected setting parameters 332. Examples for possible affected setting parameters 332 may include one or more of control parameters 334, process parameters 336, qualifier parameters 338, and/or meta parameters.

The settings manager 320 sends the other setting parameters 332 and modified value ranges for the other setting parameters 332 to the GUI 342. The GUI 342 updates the histograms for the other setting parameters 332 to reflect the modified value ranges predicted by the AI/ML models.

Figure 6:
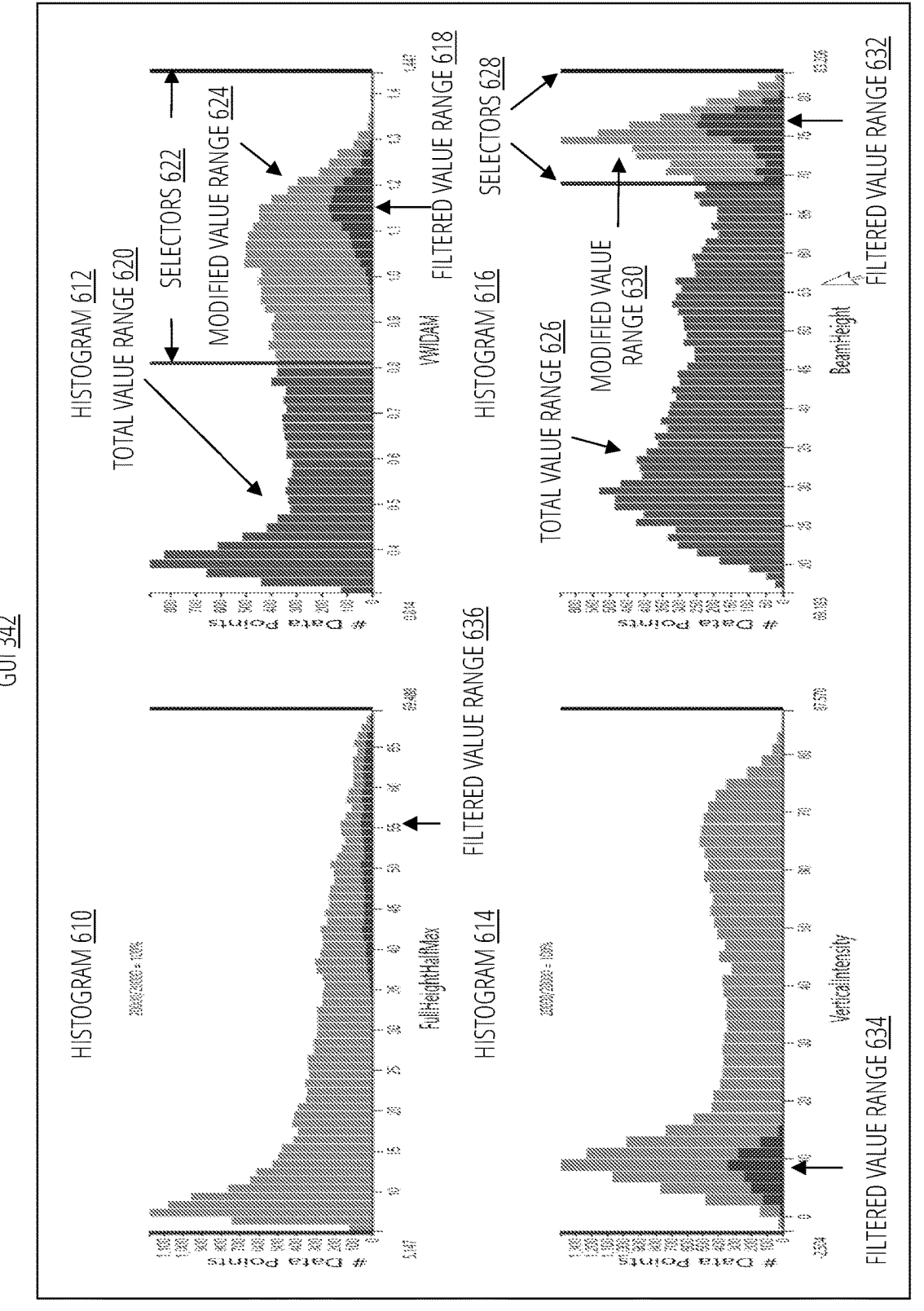
FIG. 6 illustrates an aspect of the subject matter in accordance with one embodiment.

FIG. 6 illustrates still another example of a GUI 342. As depicted in FIG. 6, the GUI 342 may display four histograms, such as histogram 610, histogram 612, histogram 614, and histogram 616. The GUI 342 may present more or less histograms for a given implementation. Embodiments are not limited to a particular number of histograms presented by the GUI 342.

Each of the histograms depicted in FIG. 6 is associated with a process parameter 528. For example, the histogram 610 is associated with a first process parameter 528 labeled "FullHeightHalfMax". The histogram 612 is associated with a second process parameter 528 labeled "VWIDAM". The histogram 614 is associated with a third process parameter 528 labeled "VerticalIntensity". The histogram 616 is associated with a fourth process parameter 528 labeled "BeamHeight". Embodiments are not limited to these examples, and other histograms may be associated with other setting parameters 332, such as control parameters 334, qualifier parameters 338, meta parameters, and so forth.

An operator may use the selector elements for each of the histograms presented by the GUI 342 to modify a value range for a histogram associated with a parameter of interest to the operator. The settings manager 320 implements a ML model, such as the mean process model 326 and/or the qualifier model 328, trained to accept as input the selected setting parameter and modified value range. The ML model makes a prediction or inference for modifications to value ranges for one or more setting parameters 332, such as a control parameter, a process parameter, a qualifier parameter, or a meta parameter. The GUI updates the histograms for the one or more setting parameters 332 to reflect modifications to the value ranges associated with each of the affected setting parameters 332.

By way of example, assume a user (or operator) uses the selectors 622 to adjust the min and max values for the histogram 612. The histogram 612 displays a total value range 620 and a modified value range 624. The modified value range 624 is depicted by a set of multiple bins with a lighter gray shading. The modified value range 624 represents data points from the total population for each value range depicted by a given bin within the current setting of the min/max values. In addition, the histogram 612 also displays an overlay or foreground of a filtered value range 618 depicted by a subset of multiple bins from the set of multiple bins for the modified value range 624, the subset of multiple bins having a darker gray shading that contrasts with the lighter gray shading of the background representing the modified value range 624. The filtered value range 618 and associated data points shows the population achievable given the current constraints of the current settings for all of the histograms depicted in the GUI 342.

Further assume a user (or operator) uses (or previously set) the selectors 628 to adjust the min and max values for the histogram 616. The histogram 616 displays a total value range 626 and a modified value range 630. The modified value range 630 is depicted by a set of multiple bins with a lighter gray shading. The modified value range 630 represents data points from the total population for each value range depicted by a given bin within the current setting of the min/max values. In addition, the histogram 616 also displays an overlay of a filtered value range 632 depicted by a subset of multiple bins from the set of multiple bins, the subset of bins having a darker gray shading that contrasts with the lighter gray shading representing the modified value range 630. The filtered value range 632 and associated data points shows the population achievable given the current constraints of the current settings for all of the histograms depicted in the GUI 342.

As shown in this example, the user adjusts the window on VWIDAM histogram 612 and/or the BeamHeight histogram 616 below. These adjustments cause the FullHeightHalfMax histogram 610 to show a filter filtered value range 636 with a passing population of around 55, the filtered value range 618 for the VWIDAM histogram 612 with a population peak of around 1.15, the VerticalIntensity histogram 614 to show a filtered value range 634 with a passing population of around 10, and the filtered value range 632 for beam height with a population peak of around 77. The lower foreground darker bars are by definition going to be lower than their background lighter bars, as only the set that passes all criteria is displayed in dark foreground. Therefore, moving any min/max window limits will impact all the other histograms simultaneously, thereby providing real-time instantaneous feedback indicating how changes in one setting parameter effects all the other setting parameters 332 presented by the GUI 342.

Figure 7:
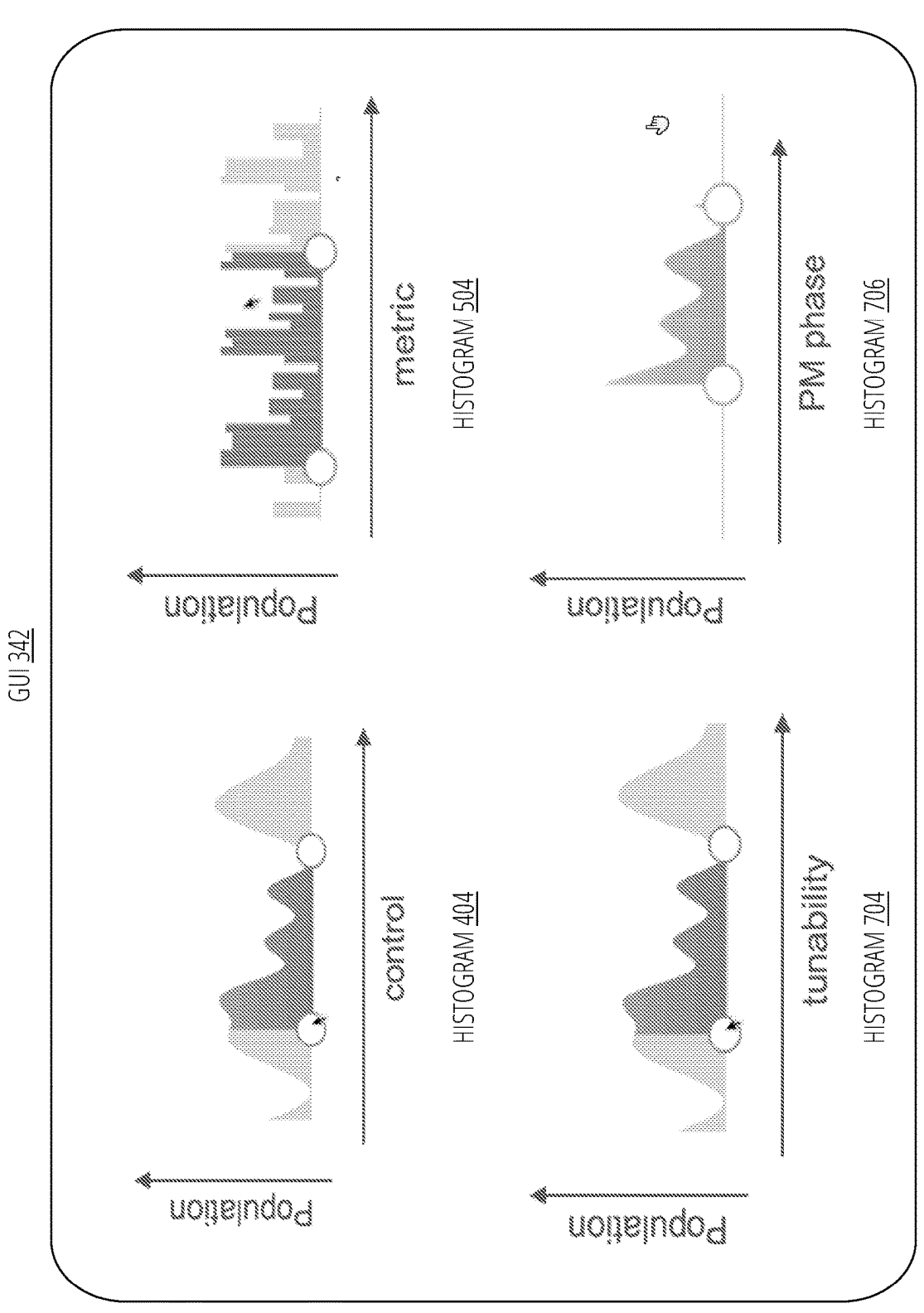
FIG. 7 illustrates a view of a GUI in accordance with one embodiment.

FIG. 7 illustrates still another example of a GUI 342. As depicted in FIG. 7, the GUI 342 may display four histograms, such as histogram 404, histogram 504, histogram 704, and histogram 706. The GUI 342 may present more or less histograms for a given implementation. Embodiments are not limited to a particular number of histograms presented by the GUI 342.

The histogram 404 is associated with a control parameter 426. The histogram 504 is associated with a process parameter 528. The histogram 704 is associated with a qualifier parameter from the qualifier parameters 338, which in this example is a tunability parameter. The histogram 706 is associated with a meta parameter, which in this example is a PM phase parameter. Embodiments are not limited to these examples, and other histograms may be associated with other setting parameters 332.

An operator may use the selector elements for each of the histograms presented by the GUI 342 to modify a value range for a histogram associated with a parameter of interest to the operator. The settings manager 320 implements a ML model, such as the mean process model 326 and/or the qualifier model 328, trained to accept as input the selected setting parameter and modified value range. The ML model makes a prediction or inference for modifications to value ranges for one or more setting parameters, such as a control parameter, a process parameter, a qualifier parameter, or a meta parameter. The GUI updates the histograms for the one or more setting parameters to reflect modifications to the value ranges associated with each of the affected setting parameters.

Figure 8A:
FIG. 8A illustrates a view of a GUI in accordance with one embodiment.

FIG. 8A illustrates another example for the GUI 342. As depicted in FIG. 8A, a histogram 802 is associated with a process parameter 528 of the process parameters 336. In this example, the process parameter 528 is a metric for an ion beam, such as Angle Metric A. Unlike FIG. 4 and FIG. 5, the histogram 802 represents total samples on a y-axis and a value range on an x-axis, where the total samples are represented as lines and shaded areas rather than bins to represent the data points per value.

Assume an operator narrows a window for the histogram 802 to decrease the total value range 514 to form a modified value range 516. All other histogram windows live update with decreased selected populations corresponding to the modified value range 516.

Alternatively, the settings manager 320 may automatically select min 522 and max 524 values for the process histogram 802 unless an operator modifies the default choices. These become the tune windows for a component of the ion implanter 102.

Figure 8B:
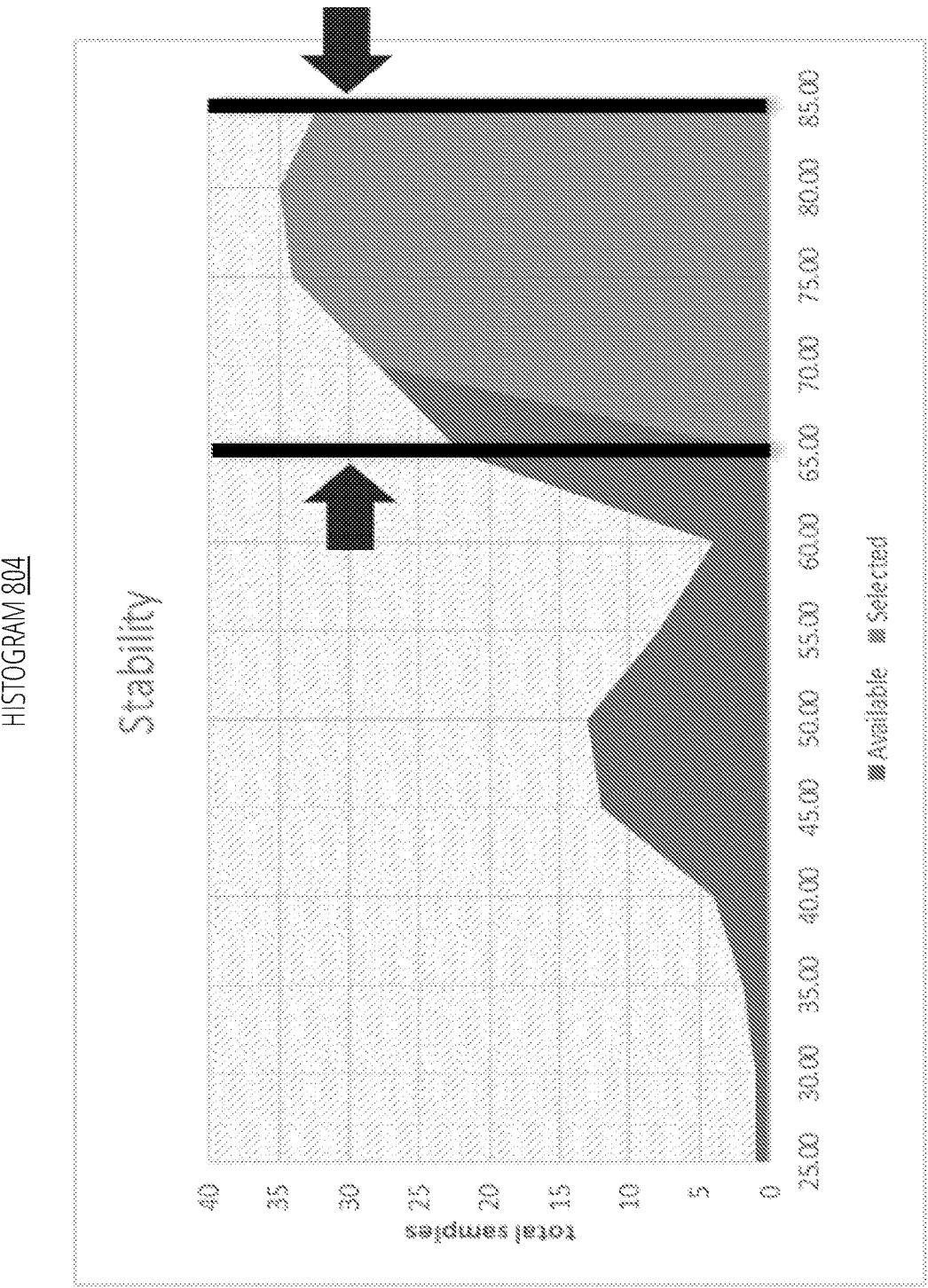
FIG. 8B illustrates a view of a GUI in accordance with one embodiment.

FIG. 8B illustrates another example for the GUI 342. As depicted in FIG. 8B, a histogram 804 is associated with a qualifier parameter of the qualifier parameters 338. In this example, the qualifier parameter is a virtual metric for an ion beam, such as tune stability. Unlike FIG. 4 and FIG. 5, the histogram 804 represents total samples on a y-axis and a value range on an x-axis, where the total samples are represented as lines and shaded areas rather than bins to represent the data points per value.

Assume an operator narrows a window for the histogram 804 to decrease the total value range to form a modified value range. All other histogram windows live update with decreased selected populations corresponding to the modified value range.

Alternatively, the settings manager 320 may automatically select min and max values for the qualifier histogram 804 unless an operator modifies the default choices. These become the tune windows for a component of the ion implanter 102.

Figure 8C:
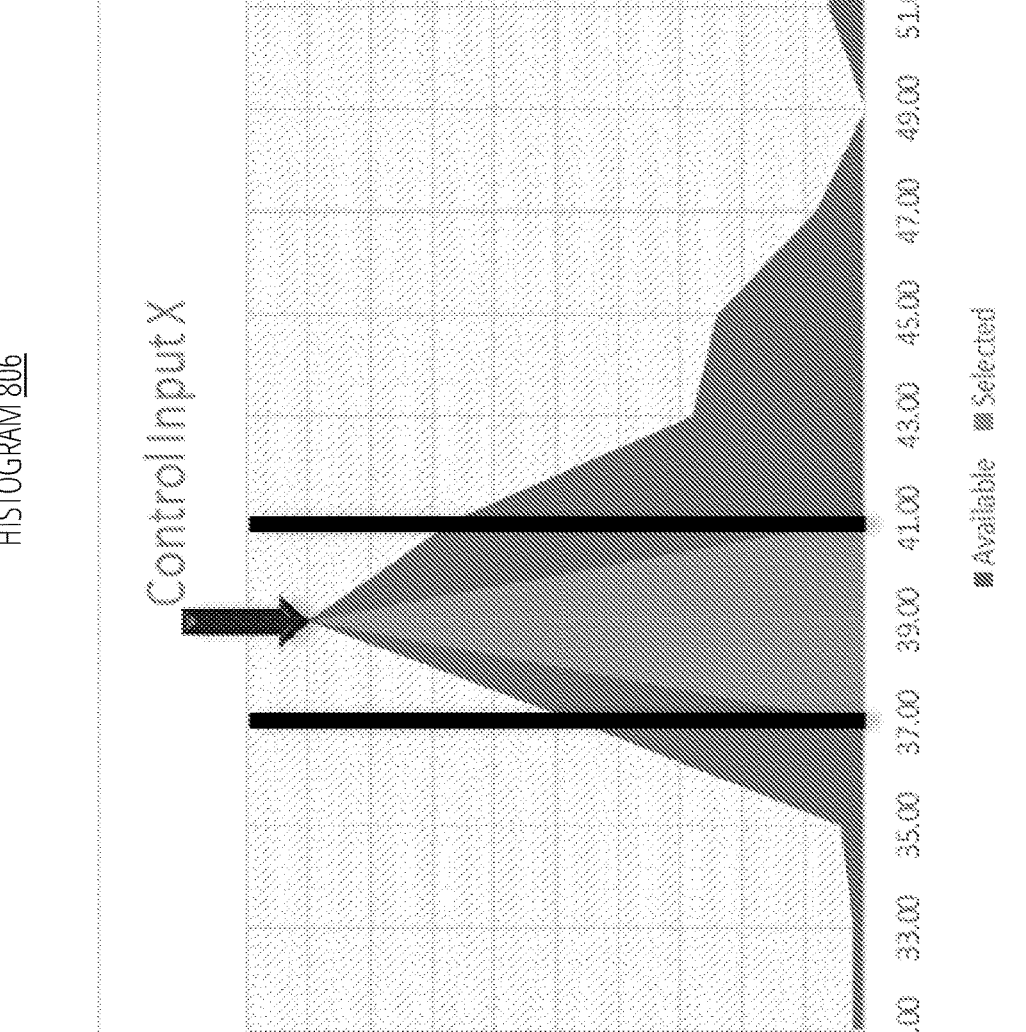
FIG. 8C illustrates a view of a GUI in accordance with one embodiment.

FIG. 8C illustrates another example for the GUI 342. As depicted in FIG. 8C, a histogram 806 is associated with a control parameter 426 of the control parameters 334. In this example, the control parameter 426 is a control setting for an ion beam, such as Control Input X, where X represents any type of control parameter 426. Unlike FIG. 4 and FIG. 5, the histogram 806 represents total samples on a y-axis and a value range on an x-axis, where the total samples are represented as lines and shaded areas rather than bins to represent the data points per value.

Assume an operator narrows a window for the histogram 806 to decrease the total value range 414 to form a modified value range 416. All other histogram windows live update with decreased selected populations corresponding to the modified value range 416.

Alternatively, the settings manager 320 may automatically select min 422 and max 424 values for the control histogram 806 unless an operator modifies the default choices. These become the tune windows for a component of the ion implanter 102.

Operations for the disclosed embodiments may be further described with reference to the following figures. Some of the figures may include a logic flow. Although such figures presented herein may include a particular logic flow, it can be appreciated that the logic flow merely provides an example of how the general functionality as described herein can be implemented. Further, a given logic flow does not necessarily have to be executed in the order presented unless otherwise indicated. Moreover, not all acts illustrated in a logic flow may be required in some embodiments. In addition, the given logic flow may be implemented by a hardware element, a software element executed by a processor, or any combination thereof. The embodiments are not limited in this context.

FIG. 9 illustrates an embodiment of a logic flow 900. The logic flow 900 may be representative of some or all of the operations executed by one or more embodiments described herein. For example, the logic flow 900 may include some or all of the operations performed by devices or entities within the inferencing system 300, the device 302, the training device 1116, or the training system 1200. More particularly, the logic flow 900 illustrates an example where the device 302 performs inferencing operations for one or more of the ML models 324.

In block 902, logic flow 900 generates a first histogram for a first setting parameter of an ion implanter, the first histogram comprising a graphical representation of a distribution of data points across a first range of values associated with the first setting parameter. In block 904, logic flow 900 generates a second histogram for a second setting parameter of the ion implanter, the second histogram comprising a graphical representation of a distribution of data points across a second range of values associated with the second setting parameter. In block 906, logic flow 900 presents the first histogram and the second histogram on a graphical user interface (GUI) of an electronic device. In block 908, logic flow 900 receives a control directive from the GUI to modify the first range of values associated with the first setting parameter. In block 910, logic flow 900 predicts a modification to the second range of values associated with the second setting parameter based on the modification to the first range of values associated with the first setting parameter by a mean process model. In block 912, logic flow 900 presents the second histogram for the second setting parameter on the GUI to indicate the modification to the second range of values associated with the second setting parameter.

By way of example, with reference to the device 302 and the histogram 404 and histogram 504 presented on the GUI 342, the settings manager 320 generates a first histogram 404 for a first setting parameter of an ion implanter 102, the first histogram 404 comprising a graphical representation of a distribution of data points across a first total value range 414 associated with the first setting parameter. For example, the first setting parameter may comprise the control parameter 426. The settings manager 320 generates a second histogram 504 for a second setting parameter of the ion implanter 102, the second histogram 504 comprising a graphical representation of a distribution of data points across a second total value range 414 associated with the second setting parameter. For example, the second setting parameter may comprise the process parameter 528. The settings manager 320 presents the first histogram 404 and the second histogram 504 on a GUI 342 of an electronic device 302. The model manager 322 receives a control directive from the GUI 342 to modify the first total value range 414 associated with the first setting parameter, which is the control parameter 426, to form a modified value range 416. The mean process model 326 predicts a modification to the second total value range 514 associated with the second setting parameter, which is the process parameter 528, to form a modified value range 516 for the second histogram 504 based on the modification to the first total value range 414 associated with the control parameter 426. For example, the mean process model 326 may comprise an artificial neural network (ANN), such as a feed forward neural network. The settings manager 320 presents the second histogram 504 for the process parameter 528 on the GUI 342 to indicate the modified value range 516 on the second histogram 504 associated with the process parameter 528. Embodiments are not limited to this example.

FIG. 10 illustrates an embodiment of a logic flow 1000. The logic flow 1000 may be representative of some or all of the operations executed by one or more embodiments described herein. For example, the logic flow 1000 may include some or all of the operations performed by devices or entities within the inferencing system 300, the device 302, the training device 1116, or the training system 1200. More particularly, the logic flow 1000 illustrates an example where the device 302 performs inferencing operations for one or more of the ML models 324.

In block 1002, logic flow 1000 generates a graphical user interface (GUI) comprising a set of GUI elements representing multiple setting parameters for an ion implanter, each setting parameter represented as a histogram comprising a set of samples for the setting parameter, the histogram to include a minimum selector element to select a minimum value for the set of samples and a maximum selector element to select a maximum value for the set of samples. In block 1004, logic flow 1000 receives a control directive to modify a minimum selector element or a maximum selector element of a first histogram for a first setting parameter of the multiple setting parameters, the control directive to select a first subset of samples from a first set of samples for the first setting parameter. In block 1006, logic flow 1000 predicts a second subset of samples from a second set of samples for a second setting parameter of the multiple setting parameters based on the first subset of samples by a mean process model, the mean process model comprising an artificial neural network (ANN). In block 1008, logic flow 1000 modifies a minimum selector or a maximum selector of a second histogram for the second setting parameter to select the second subset of samples from the set of samples for the second setting parameter.

By way of example, with reference to the device 302 and the histogram 404 and histogram 504 presented on the GUI 342, the settings manager 320 generates a GUI 342 comprising a set of GUI elements representing multiple setting parameters 332 for an ion implanter 102. Each setting parameter of the multiple setting parameters 332 is represented as a separate histogram, where each histogram comprises a set of samples for a corresponding setting parameter. The histogram includes one or more selectors 420 and selectors 520, each including a minimum selector element to select a minimum value for a set of samples and a maximum selector element to select a maximum value for a set of samples. The model manager 322 receives a control directive to modify a minimum selector element or a maximum selector element of a first histogram 404 for a first setting parameter of the multiple setting parameters 332, the control directive to select a first subset of samples from a first set of samples for the first setting parameter. The mean process model 326 predicts a second subset of samples from a second set of samples for a second setting parameter of the multiple setting parameters 332 based on the first subset of samples. For example, the mean process model 326 may comprise an artificial neural network (ANN), such as a feed forward neural network. The settings manager 320 then modifies a minimum selector or a maximum selector of a second histogram 504 for the second setting parameter to select the second subset of samples from the set of samples for the second setting parameter. Embodiments are not limited to this example.

Figure 11:
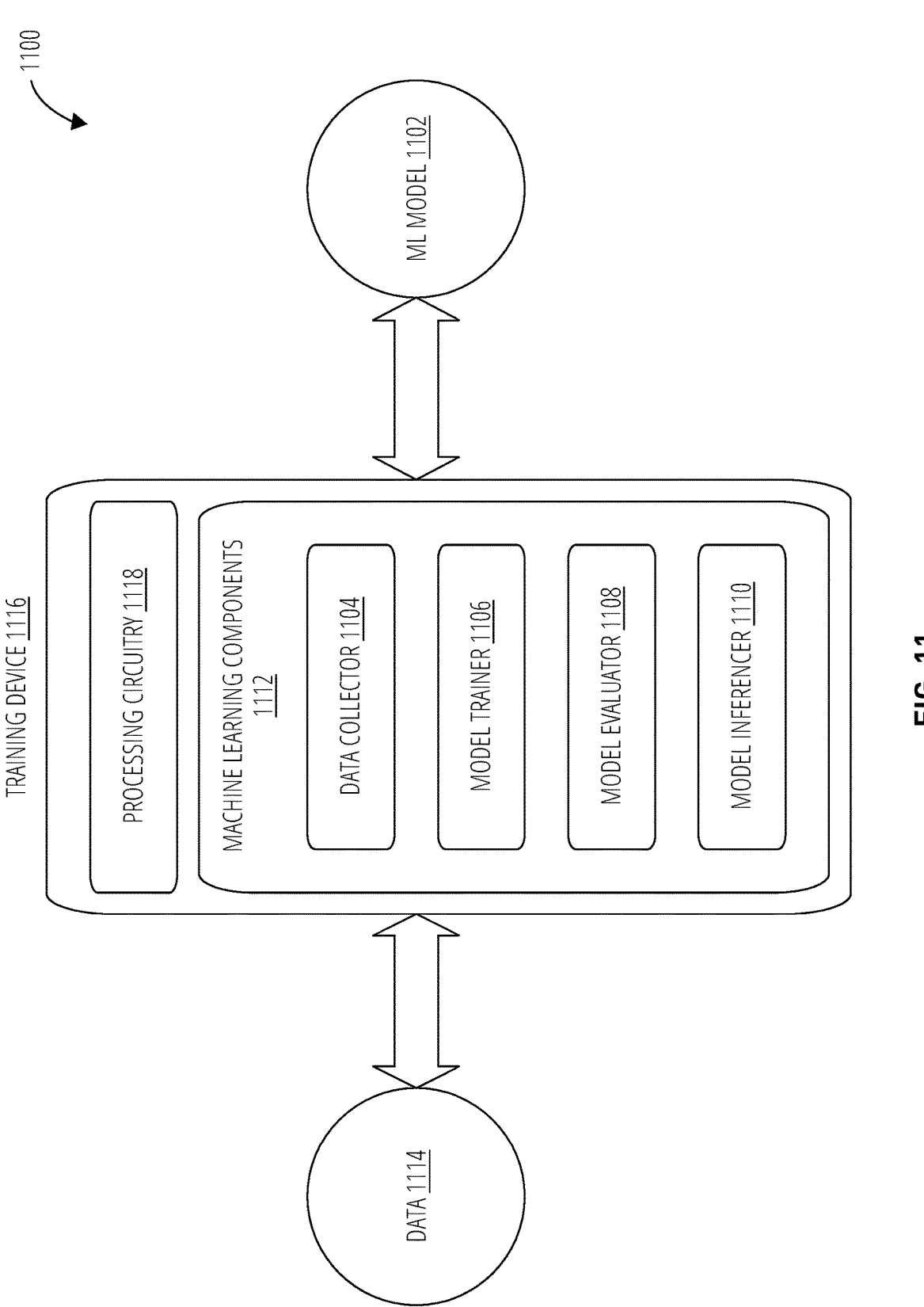
FIG. 11 illustrates a training device in accordance with one embodiment.

FIG. 11 illustrates an apparatus 1100. The apparatus 1100 depicts a training device 1116 suitable to generate a trained ML model 1102 for an inferencing device, such as the device 302 of the inferencing system 300. In one embodiment, the training device 1116 executes various ML components 1112 to generate an ML model 1102, such as a mean process model 326, a qualifier model 328 and/or an inverted control model 330 by performing various training, testing, and validation operations.

As depicted in FIG. 11, the training device 1116 includes a processing circuitry 1118 and a set of ML components 1112 to support various AI/ML techniques, such as a data collector 1104, a model trainer 1106, a model evaluator 1108 and a model inferencer 1110.

In general, the data collector 1104 collects data 1114 from one or more data sources to use as training data for the ML model 1102. The data collector 1104 collects different types of data 1114, such as text information, audio information, image information, video information, graphic information, and so forth. The model trainer 1106 receives as input the collected data and uses a portion of the collected data as test data for an AI/ML algorithm to train the ML model 1102. The model evaluator 1108 evaluates and improves the trained ML model 1102 using a portion of the collected data as test data to test the ML model 1102. The model evaluator 1108 also uses feedback information from the deployed ML model 1102. The model inferencer 1110 implements the trained ML model 1102 to receive as input new unseen data, generate one or more inferences on the new data, and output a result such as an alert, a recommendation or other post-solution activity.

An exemplary AI/ML architecture for the ML components 1112 is described in more detail with reference to FIG. 12.

Figure 12:
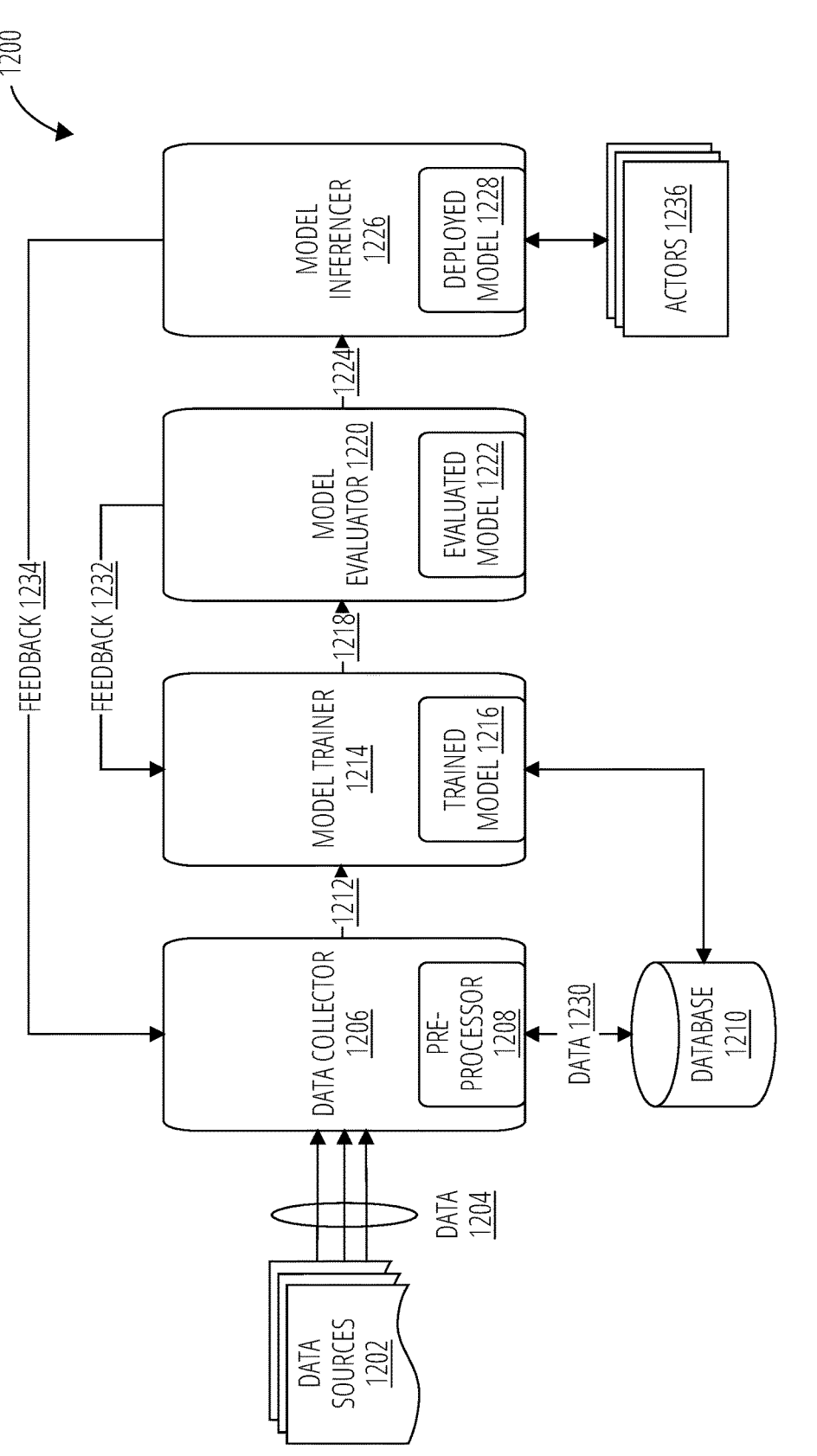
FIG. 12 illustrates a training system in accordance with one embodiment.

FIG. 12 illustrates a training system 1200. The training system 1200 is an example of a system suitable for implementing various artificial intelligence (AI) techniques and/or machine learning (ML) techniques to perform various tasks. AI is a science and technology based on principles of cognitive science, computer science and other related disciplines, which deals with the creation of intelligent machines that work and react like humans. AI is used to develop systems that can perform tasks that require human intelligence such as recognizing speech, vision and making decisions. AI can be seen as the ability for a machine or computer to think and learn, rather than just following instructions. ML is a subset of AI that uses algorithms to enable machines to learn from existing data and generate insights or predictions from that data. ML algorithms are used to optimize machine performance in various tasks such as classifying, clustering and forecasting. ML algorithms are used to create ML models that can accurately predict outcomes.

In general, the training system 1200 may include various machine or computer components (e.g., circuit, processor circuit, memory, network interfaces, compute platforms, input/output (I/O) devices, etc.) for an AI/ML system that are designed to work together to create a pipeline that can take in raw data, process it, train a ML model, evaluate its performance, deploy it in a production environment, and continuously monitor and maintain it.

A ML model is a mathematical construct used to predict outcomes based on a set of input data. ML models are trained using large volumes of data, and they can recognize patterns and trends in that data to make accurate predictions. The ML models are derived from different ML algorithms. The ML algorithms may comprise supervised algorithms, unsupervised algorithms, or semi-supervised algorithms.

A supervised algorithm is a type of machine learning algorithm that uses labeled data to train a model. In supervised learning, the algorithm is given a set of input data and corresponding output data, which are used to train the model to make predictions or classifications. The input data is also known as the features, and the output data is known as the target or label. The goal of a supervised algorithm is to learn the relationship between the input features and the target labels, so that it can make accurate predictions or classifications for new, unseen data. Examples of supervised learning algorithms include: (1) linear regression which is a regression algorithm used to predict continuous numeric values, such as stock prices or temperature; (2) logistic regression which is a classification algorithm used to predict binary outcomes, such as whether a customer will churn or not; (3) decision tree which is a classification algorithm used to predict categorical outcomes by creating a decision tree based on the input features; or (4) random forest which is an ensemble algorithm that combines multiple decision trees to make more accurate predictions.

An unsupervised algorithm is a type of machine learning algorithm that is used to find patterns and relationships in a dataset without the need for labeled data. Unlike supervised learning, where the algorithm is provided with labeled training data and learns to make predictions based on that data, unsupervised learning works with unlabeled data and seeks to identify underlying structures or patterns. Unsupervised learning algorithms use a variety of techniques to discover patterns in the data, such as clustering, anomaly detection, and dimensionality reduction. Clustering algorithms group similar data points together, while anomaly detection algorithms identify unusual or unexpected data points. Dimensionality reduction algorithms are used to reduce the number of features in a dataset, making it easier to analyze and visualize. Unsupervised learning has many applications, such as in data mining, pattern recognition, and recommendation systems. It is particularly useful for tasks where labeled data is scarce or difficult to obtain, and where the goal is to gain insights and understanding from the data itself rather than to make predictions based on it.

Semi-supervised learning is a type of machine learning algorithm that combines both labeled and unlabeled data to improve the accuracy of predictions or classifications. In this approach, the algorithm is trained on a small amount of labeled data and a much larger amount of unlabeled data. The main idea behind semi-supervised learning is that labeled data is often scarce and expensive to obtain, whereas unlabeled data is abundant and easy to collect. By leveraging both types of data, semi-supervised learning can achieve higher accuracy and better generalization than either supervised or unsupervised learning alone. In semi-supervised learning, the algorithm first uses the labeled data to learn the underlying structure of the problem. It then uses this knowledge to identify patterns and relationships in the unlabeled data, and to make predictions or classifications based on these patterns. Semi-supervised learning has many applications, such as in speech recognition, natural language processing, and computer vision. It is particularly useful for tasks where labeled data is expensive or time-consuming to obtain, and where the goal is to improve the accuracy of predictions or classifications by leveraging large amounts of unlabeled data.

The training system 1200 may implement various types of ML algorithms including supervised algorithms, unsupervised algorithms, semi-supervised algorithms, or a combination thereof. A few examples of ML algorithms include support vector machine (SVM), random forests, naive Bayes, K-means clustering, neural networks, and so forth. A SVM is an algorithm that can be used for both classification and regression problems. It works by finding an optimal hyperplane that maximizes the margin between the two classes. Random forests is a type of decision tree algorithm that is used to make predictions based on a set of randomly selected features. Naive Bayes is a probabilistic classifier that makes predictions based on the probability of certain events occurring. K-Means Clustering is an unsupervised learning algorithm that groups data points into clusters. Neural networks is a type of machine learning algorithm that is designed to mimic the behavior of neurons in the human brain. Other examples of ML algorithms include an artificial neural network (ANN), convolutional neural network (CNN), deep learning, decision tree learning, support-vector machine, regression analysis, Bayesian networks, genetic algorithms, federated learning, distributed artificial intelligence, and various other ML algorithms.

As depicted in FIG. 12, the training system 1200 includes a set of data sources 1202 to source data 1204 for the training system 1200. Data sources 1202 may comprise any device capable generating, processing, storing or managing data 1204 suitable for a ML system. Examples of data sources 1202 include without limitation databases, web scraping, sensors and Internet of Things (IoT) devices, image and video cameras, audio devices, text generators, publicly available databases, private databases, and many other data sources 1202. The data sources 1202 may be remote from the training system 1200 and accessed via a network, local to the training system 1200 an accessed via a network interface, or may be a combination of local and remote data sources 1202.

The data sources 1202 may source difference types of data 1204. For instance, the data 1204 may comprise structured data from relational databases, such as customer profiles, transaction histories, or product inventories. The data 1204 may comprise unstructured data from websites such as customer reviews, news articles, social media posts, or product specifications. The data 1204 may comprise data from temperature sensors, motion detectors, and smart home appliances. The data 1204 may comprise image data from medical images, security footage, or satellite images. The data 1204 may comprise audio data from speech recognition, music recognition, or call centers. The data 1204 may comprise text data from emails, chat logs, customer feedback, news articles or social media posts. The data 1204 may comprise publicly available datasets such as those from government agencies, academic institutions, or research organizations. These are just a few examples of the many sources of data that can be used for ML systems. It is important to note that the quality and quantity of the data is critical for the success of a machine learning project.

The data 1204 can be in different formats such as structured, unstructured or semi-structured data. Structured data refers to data that is organized in a specific format or schema, such as tables or spreadsheets. Structured data has a well-defined set of rules that dictate how the data should be organized and represented, including the data types and relationships between data elements. Unstructured data refers to any data that does not have a predefined or organized format or schema. Unlike structured data, which is organized in a specific way, unstructured data can take various forms, such as text, images, audio, or video. Unstructured data can come from a variety of sources, including social media, emails, sensor data, and website content. Semi-structured data is a type of data that does not fit neatly into the traditional categories of structured and unstructured data. It has some structure but does not conform to the rigid structure of a traditional relational database. Semi-structured data is characterized by the presence of tags or metadata that provide some structure and context for the data.

The data sources 1202 may be communicatively coupled to a data collector 1206. The data collector 1206 gathers relevant data 1204 from the data sources 1202. Once collected, the data collector 1206 may use a pre-processor 1208 to make the data 1204 suitable for analysis. This involves data cleaning, transformation, and feature engineering. Data preprocessing is a critical step in ML as it directly impacts the accuracy and effectiveness of the model. The pre-processor 1208 may receive the data 1204 as input, process the data 1204, and output pre-processed data 1230 for storage in a database 1210. The database 1210 may comprise a hard drive, solid state storage, and/or random access memory.

The data collector 1206 may be communicatively coupled to a model trainer 1214. The model trainer 1214 performs AI/ML model training, validation, and testing which may generate model performance metrics as part of the model testing procedure. The model trainer 1214 may receive the pre-processed data 1230 as input 1212 or via the database 1210. The model trainer 1214 may implement a suitable ML algorithm to train an ML model on the pre-processed data 1230. The training process involves feeding the pre-processed data 1230 into a ML model to form a trained model 1216. The training process adjusts its parameters until it achieves an initial level of satisfactory performance.

The model trainer 1214 may be communicatively coupled to a model evaluator 1220. After a ML model is trained, the trained model 1216 needs to be evaluated to assess its performance. This is done using various metrics such as accuracy, precision, recall, and F1 score. The model trainer 1214 may output the trained model 1216, which is received as input 1212. The model evaluator 1220 receives the trained model 1216, and it initiates an evaluation process to measure performance of the trained model 1216. The evaluation process may include providing feedback 1232 to the model trainer 1214, so that it may re-train the trained model 1216 to improve performance in an iterative manner.

The model evaluator 1220 may be communicatively coupled to a model inferencer 1226. The model inferencer 1226 provides AI/ML model inference output (e.g., predictions or decisions). Once the ML model is trained and evaluated, it can be deployed in a production environment where it can be used to make predictions on new data. The model inferencer 1226 receives the evaluated model 1222 as input 1224. The model inferencer 1226 may use the evaluated model 1222 as a deployed model 1228, which is a final production ML model. The inference output of the deployed model 1228 is use case specific. The model inferencer 1226 may also perform model monitoring and maintenance, which involves continuously monitoring performance of the deployed model 1228 in the production environment and making any necessary updates or modifications to maintain its accuracy and effectiveness. The model inferencer 1226 may provide feedback 1232 to the data collector 1206 to train or re-train the ML model. The feedback 1232 may include model performance feedback information, which may be used for monitoring and improving performance of the deployed model 1228.

The model inferencer 1226 may be implemented by various actors 1236 in the training system 1200. The actors 1236 may use the deployed model 1228 on new data to make inferences or predictions for a given task. The actors 1236 may actually implement the model inferencer 1226, or receive outputs from the model inferencer 1226 in a distributed computing manner. The actors 1236 may trigger actions directed to other entities or to itself. The actors 1236 may provide feedback 1234 to the data collector 1206 via the model inferencer 1226. The feedback 1234 may comprise data needed to derive training data, inference data or to monitor the performance of the AI/ML model and its impact to the network through updating of key performance indicators (KPIs) and performance counters.

The training system 1200 may be applicable to various use cases and solutions for AI/ML tasks, such as the inferencing system 300 and/or training system 1300. Other use cases and solutions for AI/ML are possible as well, and embodiments are not limited in this context.

Figure 13:
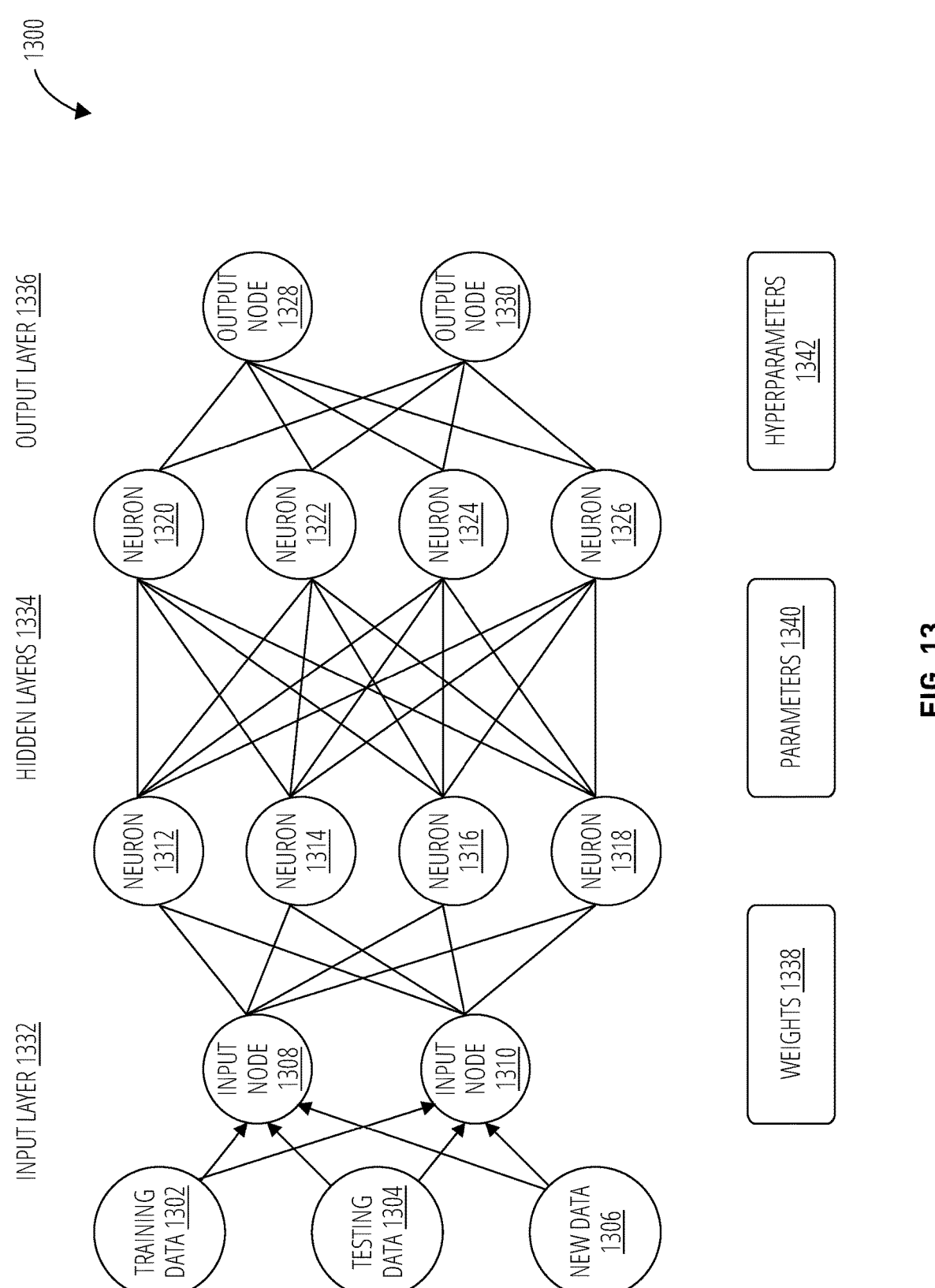
FIG. 13 illustrates an artificial neural network in accordance with one embodiment.

FIG. 13 illustrates an embodiment of an artificial neural network 1300. Neural networks, also known as artificial neural networks (ANNs) or simulated neural networks (SNNs), are a subset of machine learning and are at the core of deep learning algorithms. Their name and structure are inspired by the human brain, mimicking the way that biological neurons signal to one another.

Artificial neural network 1300 comprises multiple node layers, containing an input layer 1332, one or more hidden layers 1334, and an output layer 1336. Each layer comprises one or more nodes. As depicted in FIG. 13, for example, the input layer 1332 has input node 1308 and input node 1310. The artificial neural network 1300 has two hidden layers 1334, with a first hidden layer having neuron 1312, neuron 1314, neuron 1316 and neuron 1318, and a second hidden layer having neuron 1320, neuron 1322, neuron 1324 and neuron 1326. The artificial neural network 1300 has an output layer 1336 with output node 1328 and output node 1330. Each node or neuron comprises a processing element (PE), or artificial neuron, that connects to another and has an associated weight and threshold. If the output of any individual node is above the specified threshold value, that node is activated, sending data to the next layer of the network. Otherwise, no data is passed along to the next layer of the network.

In general, artificial neural network 1300 relies on training data 1302 to learn and improve accuracy over time. However, once the artificial neural network 1300 is fine-tuned for accuracy, and tested on testing data 1304, the artificial neural network 1300 is ready to classify and cluster new data 1306 at a high velocity. Tasks in speech recognition, image recognition, or calculating continuous values can take minutes versus hours when compared to the manual identification by human experts.

The artificial neural network 1300 is a linear regression model, composed of input data, weights, a bias (or threshold), and an output. Once an input layer 1332 is determined, a set of weights 1338 are assigned. The weights 1338 help determine the importance of any given variable, with larger ones contributing more significantly to the output compared to other inputs. All inputs are then multiplied by their respective weights and then summed. Afterward, the output is passed through an activation function, which determines the output. If that output exceeds a given threshold, it "fires" (or activates) the node, passing data to the next layer in the network. This results in the output of one node becoming in the input of the next node. The process of passing data from one layer to the next layer defines the artificial neural network 1300 as a feedforward network.

In one embodiment, the artificial neural network 1300 leverages sigmoid neurons, which are distinguished by having values between 0 and 1. Since the artificial neural network 1300 behaves similarly to a decision tree, cascading data from one node to another, having x values between 0 and 1 will reduce the impact of any given change of a single variable on the output of any given node, and subsequently, the output of the artificial neural network 1300.

The artificial neural network 1300 has many practical use cases, like image recognition, speech recognition, text recognition or classification. The artificial neural network 1300 leverages supervised learning, or labeled datasets, to train the algorithm. As the model is trained, its accuracy is measured using a cost (or loss) function. This is also commonly referred to as the mean squared error (MSE).

Ultimately, the goal is to minimize the cost function to ensure correctness of fit for any given observation. As the model adjusts its weights and bias, it uses the cost function and reinforcement learning to reach the point of convergence, or the local minimum. The process in which the algorithm adjusts its weights is through gradient descent, allowing the model to determine the direction to take to reduce errors (or minimize the cost function). With each training example, the parameters 1340 of the model adjust to gradually converge at the minimum.

In one embodiment, the artificial neural network 1300 is feedforward, meaning it flows in one direction only, from input to output. In one embodiment, the artificial neural network 1300 uses backpropagation. Backpropagation is when the artificial neural network 1300 moves in the opposite direction from output to input. Backpropagation allows calculation and attribution of errors associated with each neuron, thereby allowing adjustment to fit the parameters 1340 of the ML model 1102 appropriately.

The artificial neural network 1300 is implemented as different neural networks depending on a given task. Neural networks are classified into different types, which are used for different purposes. In one embodiment, the artificial neural network 1300 is implemented as a feedforward neural network, or multi-layer perceptrons (MLPs), comprised of an input layer 1332, hidden layers 1334, and an output layer 1336. While these neural networks are also commonly referred to as MLPs, they are actually comprised of sigmoid neurons, not perceptrons, as most real-world problems are nonlinear. Trained data 1204 usually is fed into these models to train them, and they are the foundation for computer vision, natural language processing, and other neural networks. In one embodiment, the artificial neural network 1300 is implemented as a convolutional neural network (CNN). A CNN is similar to feedforward networks, but usually utilized for image recognition, pattern recognition, and/or computer vision. These networks harness principles from linear algebra, particularly matrix multiplication, to identify patterns within an image. In one embodiment, the artificial neural network 1300 is implemented as a recurrent neural network (RNN). A RNN is identified by feedback loops. The RNN learning algorithms are primarily leveraged when using time-series data to make predictions about future outcomes, such as stock market predictions or sales forecasting. The artificial neural network 1300 is implemented as any type of neural network suitable for a given operational task of inferencing system 300, and the MLP, CNN, and RNN are merely a few examples. Embodiments are not limited in this context.

The artificial neural network 1300 includes a set of associated parameters 1340. There are a number of different parameters that must be decided upon when designing a neural network. Among these parameters are the number of layers, the number of neurons per layer, the number of training iterations, and so forth. Some of the more important parameters in terms of training and network capacity are a number of hidden neurons parameter, a learning rate parameter, a momentum parameter, a training type parameter, an Epoch parameter, a minimum error parameter, and so forth.

In some cases, the artificial neural network 1300 is implemented as a deep learning neural network. The term deep learning neural network refers to a depth of layers in a given neural network. A neural network that has more than three layers—which would be inclusive of the inputs and the output—can be considered a deep learning algorithm. A neural network that only has two or three layers, however, may be referred to as a basic neural network. A deep learning neural network may tune and optimize one or more hyperparameters 1342. A hyperparameter is a parameter whose values are set before starting the model training process. Deep learning models, including convolutional neural network (CNN) and recurrent neural network (RNN) models can have anywhere from a few hyperparameters to a few hundred hyperparameters. The values specified for these hyperparameters impacts the model learning rate and other regulations during the training process as well as final model performance. A deep learning neural network uses hyperparameter optimization algorithms to automatically optimize models. The algorithms used include Random Search, Tree-structured Parzen Estimator (TPE) and Bayesian optimization based on the Gaussian process. These algorithms are combined with a distributed training engine for quick parallel searching of the optimal hyperparameter values.

Figure 14:
FIG. 14 illustrates computer readable medium (CRM) in accordance with one embodiment.

FIG. 14 illustrates an apparatus 1400. Apparatus 1400 may comprise any non-transitory computer-readable storage medium 1402 or machine-readable storage medium, such as an optical, magnetic or semiconductor storage medium. In various embodiments, apparatus 1400 may comprise an article of manufacture or a product. In some embodiments, the computer-readable storage medium 1402 may store computer executable instructions with which circuitry can execute. For example, computer executable instructions 1404 can include instructions to implement operations described with respect to any logic flows described herein. Examples of computer-readable storage medium 1402 or machine-readable storage medium may include any tangible media capable of storing electronic data, including volatile memory or non-volatile memory, removable or non-removable memory, erasable or non-erasable memory, writeable or re-writeable memory, and so forth. Examples of computer executable instructions 1404 may include any suitable type of code, such as source code, compiled code, interpreted code, executable code, static code, dynamic code, object-oriented code, visual code, and the like.

FIG. 15 illustrates an embodiment of a computing architecture 1500. Computing architecture 1500 is a computer system with multiple processor cores such as a distributed computing system, supercomputer, high-performance computing system, computing cluster, mainframe computer, mini-computer, client-server system, personal computer (PC), workstation, server, portable computer, laptop computer, tablet computer, handheld device such as a personal digital assistant (PDA), or other device for processing, displaying, or transmitting information. Similar embodiments may comprise, e.g., entertainment devices such as a portable music player or a portable video player, a smart phone or other cellular phone, a telephone, a digital video camera, a digital still camera, an external storage device, or the like. Further embodiments implement larger scale server configurations. In other embodiments, the computing architecture 1500 may have a single processor with one core or more than one processor. Note that the term "processor" refers to a processor with a single core or a processor package with multiple processor cores. In at least one embodiment, the computing architecture 1500 is representative of the components of the inferencing system 300. More generally, the computing architecture 1500 is configured to implement all logic, systems, logic flows, methods, apparatuses, and functionality described herein with reference to previous figures.

As used in this application, the terms "system" and "component" and "module" are intended to refer to a computer-related entity, either hardware, a combination of hardware and software, software, or software in execution, examples of which are provided by the exemplary computing architecture 1500. For example, a component can be, but is not limited to being, a process running on a processor, a processor, a hard disk drive, multiple storage drives (of optical and/or magnetic storage medium), an object, an executable, a thread of execution, a program, and/or a computer. By way of illustration, both an application running on a server and the server can be a component. One or more components can reside within a process and/or thread of execution, and a component can be localized on one computer and/or distributed between two or more computers. Further, components may be communicatively coupled to each other by various types of communications media to coordinate operations. The coordination may involve the uni-directional or bi-directional exchange of information. For instance, the components may communicate information in the form of signals communicated over the communications media. The information can be implemented as signals allocated to various signal lines. In such allocations, each message is a signal. Further embodiments, however, may alternatively employ data messages. Such data messages may be sent across various connections. Exemplary connections include parallel interfaces, serial interfaces, and bus interfaces.

As shown in FIG. 15, computing architecture 1500 comprises a system-on-chip (SoC) 1502 for mounting platform components. System-on-chip (SoC) 1502 is a point-to-point (P2P) interconnect platform that includes a first processor 1504 and a second processor 1506 coupled via a point-to-point interconnect 1570 such as an Ultra Path Interconnect (UPI). In other embodiments, the computing architecture 1500 may be of another bus architecture, such as a multi-drop bus. Furthermore, each of processor 1504 and processor 1506 may be processor packages with multiple processor cores including core(s) 1508 and core(s) 1510, respectively. While the computing architecture 1500 is an example of a two-socket (2S) platform, other embodiments may include more than two sockets or one socket. For example, some embodiments may include a four-socket (4S) platform or an eight-socket (8S) platform. Each socket is a mount for a processor and may have a socket identifier. Note that the term platform may refers to a motherboard with certain components mounted such as the processor 1504 and chipset 1532. Some platforms may include additional components and some platforms may only include sockets to mount the processors and/or the chipset. Furthermore, some platforms may not have sockets (e.g. SoC, or the like). Although depicted as a SoC 1502, one or more of the components of the SoC 1502 may also be included in a single die package, a multi-chip module (MCM), a multi-die package, a chiplet, a bridge, and/or an interposer. Therefore, embodiments are not limited to a SoC.

The processor 1504 and processor 1506 can be any of various commercially available processors, including without limitation an Intel® Celeron®, Core®, Core (2) Duo®, Itanium®, Pentium®, Xeon®, and XScale® processors; AMD® Athlon®, Duron® and Opteron® processors; ARM® application, embedded and secure processors; IBM® and Motorola® DragonBall® and PowerPC® processors; IBM and Sony® Cell processors; and similar processors. Dual microprocessors, multi-core processors, and other multi-processor architectures may also be employed as the processor 1504 and/or processor 1506. Additionally, the processor 1504 need not be identical to processor 1506.

Processor 1504 includes an integrated memory controller (IMC) 1520 and point-to-point (P2P) interface 1524 and P2P interface 1528. Similarly, the processor 1506 includes an IMC 1522 as well as P2P interface 1526 and P2P interface 1530. IMC 1520 and IMC 1522 couple the processor 1504 and processor 1506, respectively, to respective memories (e.g., memory 1516 and memory 1518). Memory 1516 and memory 1518 may be portions of the main memory (e.g., a dynamic random-access memory (DRAM)) for the platform such as double data rate type 4 (DDR4) or type 5 (DDR5) synchronous DRAM (SDRAM). In the present embodiment, the memory 1516 and the memory 1518 locally attach to the respective processors (i.e., processor 1504 and processor 1506). In other embodiments, the main memory may couple with the processors via a bus and shared memory hub. Processor 1504 includes registers 1512 and processor 1506 includes registers 1514.

Computing architecture 1500 includes chipset 1532 coupled to processor 1504 and processor 1506. Furthermore, chipset 1532 can be coupled to storage device 1550, for example, via an interface (I/F) 1538. The I/F 1538 may be, for example, a Peripheral Component Interconnect-enhanced (PCIe) interface, a Compute Express Link® (CXL) interface, or a Universal Chiplet Interconnect Express (UCIe) interface. Storage device 1550 can store instructions executable by circuitry of computing architecture 1500 (e.g., processor 1504, processor 1506, GPU 1548, accelerator 1554, vision processing unit 1556, or the like). For example, storage device 1550 can store instructions for device 302, devices 312, devices 316, or the like.

Processor 1504 couples to the chipset 1532 via P2P interface 1528 and P2P 1534 while processor 1506 couples to the chipset 1532 via P2P interface 1530 and P2P 1536. Direct media interface (DMI) 1576 and DMI 1578 may couple the P2P interface 1528 and the P2P 1534 and the P2P interface 1530 and P2P 1536, respectively. DMI 1576 and DMI 1578 may be a high-speed interconnect that facilitates, e.g., eight Giga Transfers per second (GT/s) such as DMI 3.0. In other embodiments, the processor 1504 and processor 1506 may interconnect via a bus.

The chipset 1532 may comprise a controller hub such as a platform controller hub (PCH). The chipset 1532 may include a system clock to perform clocking functions and include interfaces for an I/O bus such as a universal serial bus (USB), peripheral component interconnects (PCIs), CXL interconnects, UCIe interconnects, interface serial peripheral interconnects (SPIs), integrated interconnects (I2Cs), and the like, to facilitate connection of peripheral devices on the platform. In other embodiments, the chipset 1532 may comprise more than one controller hub such as a chipset with a memory controller hub, a graphics controller hub, and an input/output (I/O) controller hub.

In the depicted example, chipset 1532 couples with a trusted platform module (TPM) 1544 and UEFI, BIOS, FLASH circuitry 1546 via I/F 1542. The TPM 1544 is a dedicated microcontroller designed to secure hardware by integrating cryptographic keys into devices. The UEFI, BIOS, FLASH circuitry 1546 may provide pre-boot code.

Furthermore, chipset 1532 includes the I/F 1538 to couple chipset 1532 with a high-performance graphics engine, such as, graphics processing circuitry or a graphics processing unit (GPU) 1548. In other embodiments, the computing architecture 1500 may include a flexible display interface (FDI) (not shown) between the processor 1504 and/or the processor 1506 and the chipset 1532. The FDI interconnects a graphics processor core in one or more of processor 1504 and/or processor 1506 with the chipset 1532.

The computing architecture 1500 is operable to communicate with wired and wireless devices or entities via the network interface (NIC) 180 using the IEEE 802 family of standards, such as wireless devices operatively disposed in wireless communication (e.g., IEEE 802.11 over-the-air modulation techniques). This includes at least Wi-Fi (or Wireless Fidelity), WiMax, and Bluetooth™ wireless technologies, 3G, 4G, LTE wireless technologies, among others. Thus, the communication can be a predefined structure as with a conventional network or simply an ad hoc communication between at least two devices. Wi-Fi networks use radio technologies called IEEE 802.11x (a, b, g, n, ac, ax, etc.) to provide secure, reliable, fast wireless connectivity. A Wi-Fi network can be used to connect computers to each other, to the Internet, and to wired networks (which use IEEE 802.3-related media and functions).

Additionally, accelerator 1554 and/or vision processing unit 1556 can be coupled to chipset 1532 via I/F 1538. The accelerator 1554 is representative of any type of accelerator device (e.g., a data streaming accelerator, cryptographic accelerator, cryptographic co-processor, an offload engine, etc.). One example of an accelerator 1554 is the Intel® Data Streaming Accelerator (DSA). The accelerator 1554 may be a device including circuitry to accelerate copy operations, data encryption, hash value computation, data comparison operations (including comparison of data in memory 1516 and/or memory 1518), and/or data compression. For example, the accelerator 1554 may be a USB device, PCI device, PCIe device, CXL device, UCIe device, and/or an SPI device. The accelerator 1554 can also include circuitry arranged to execute machine learning (ML) related operations (e.g., training, inference, etc.) for ML models. Generally, the accelerator 1554 may be specially designed to perform computationally intensive operations, such as hash value computations, comparison operations, cryptographic operations, and/or compression operations, in a manner that is more efficient than when performed by the processor 1504 or processor 1506. Because the load of the computing architecture 1500 may include hash value computations, comparison operations, cryptographic operations, and/or compression operations, the accelerator 1554 can greatly increase performance of the computing architecture 1500 for these operations.

The accelerator 1554 may include one or more dedicated work queues and one or more shared work queues (each not pictured). Generally, a shared work queue is configured to store descriptors submitted by multiple software entities.

The software may be any type of executable code, such as a process, a thread, an application, a virtual machine, a container, a microservice, etc., that share the accelerator 1554. For example, the accelerator 1554 may be shared according to the Single Root I/O virtualization (SR-IOV) architecture and/or the Scalable I/O virtualization (S-IOV) architecture. Embodiments are not limited in these contexts. In some embodiments, software uses an instruction to atomically submit the descriptor to the accelerator 1554 via a non-posted write (e.g., a deferred memory write (DMWr)). One example of an instruction that atomically submits a work descriptor to the shared work queue of the accelerator 1554 is the ENQCMD command or instruction (which may be referred to as "ENQCMD" herein) supported by the Intel® Instruction Set Architecture (ISA). However, any instruction having a descriptor that includes indications of the operation to be performed, a source virtual address for the descriptor, a destination virtual address for a device-specific register of the shared work queue, virtual addresses of parameters, a virtual address of a completion record, and an identifier of an address space of the submitting process is representative of an instruction that atomically submits a work descriptor to the shared work queue of the accelerator 1554. The dedicated work queue may accept job submissions via commands such as the movdir64b instruction.

Various I/O devices 1560 and display 1552 couple to the bus 1572, along with a bus bridge 1558 which couples the bus 1572 to a second bus 1574 and an I/F 1540 that connects the bus 1572 with the chipset 1532. In one embodiment, the second bus 1574 may be a low pin count (LPC) bus. Various devices may couple to the second bus 1574 including, for example, a keyboard 1562, a mouse 1564 and communication devices 1566.

Furthermore, an audio I/O 1568 may couple to second bus 1574. Many of the I/O devices 1560 and communication devices 1566 may reside on the system-on-chip (SoC) 1502 while the keyboard 1562 and the mouse 1564 may be add-on peripherals. In other embodiments, some or all the I/O devices 1560 and communication devices 1566 are add-on peripherals and do not reside on the system-on-chip (SoC) 1502.

The components and features of the devices described above may be implemented using any combination of discrete circuitry, application specific integrated circuits (ASICs), logic gates and/or single chip architectures. Further, the features of the devices may be implemented using microcontrollers, programmable logic arrays and/or microprocessors or any combination of the foregoing where suitably appropriate. It is noted that hardware, firmware and/or software elements may be collectively or individually referred to herein as "logic" or "circuit."

It will be appreciated that the exemplary devices shown in the block diagrams described above may represent one functionally descriptive example of many potential implementations. Accordingly, division, omission or inclusion of block functions depicted in the accompanying figures does not infer that the hardware components, circuits, software and/or elements for implementing these functions would necessarily be divided, omitted, or included in embodiments.

At least one computer-readable storage medium may include instructions that, when executed, cause a system to perform any of the computer-implemented methods described herein.

Some embodiments may be described using the expression "one embodiment" or "an embodiment" along with their derivatives. These terms mean that a particular feature, structure, or characteristic described in connection with the embodiment is included in at least one embodiment. The appearances of the phrase "in one embodiment" in various places in the specification are not necessarily all referring to the same embodiment. Moreover, unless otherwise noted the features described above are recognized to be usable together in any combination. Thus, any features discussed separately may be employed in combination with each other unless it is noted that the features are incompatible with each other.

With general reference to notations and nomenclature used herein, the detailed descriptions herein may be presented in terms of program procedures executed on a computer or network of computers. These procedural descriptions and representations are used by those skilled in the art to most effectively convey the substance of their work to others skilled in the art.

A procedure is here, and generally, conceived to be a self-consistent sequence of operations leading to a desired result. These operations are those requiring physical manipulations of physical quantities. Usually, though not necessarily, these quantities take the form of electrical, magnetic or optical signals capable of being stored, transferred, combined, compared, and otherwise manipulated. It proves convenient at times, principally for reasons of common usage, to refer to these signals as bits, values, elements, symbols, characters, terms, numbers, or the like. It should be noted, however, that all of these and similar terms are to be associated with the appropriate physical quantities and are merely convenient labels applied to those quantities.

Further, the manipulations performed are often referred to in terms, such as adding or comparing, which are commonly associated with mental operations performed by a human operator. No such capability of a human operator is necessary, or desirable in most cases, in any of the operations described herein, which form part of one or more embodiments. Rather, the operations are machine operations. Useful machines for performing operations of various embodiments include general purpose digital computers or similar devices.

Some embodiments may be described using the expression "coupled" and "connected" along with their derivatives. These terms are not necessarily intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other.

Various embodiments also relate to apparatus or systems for performing these operations. This apparatus may be specially constructed for the required purpose or it may comprise a general purpose computer as selectively activated or reconfigured by a computer program stored in the computer. The procedures presented herein are not inherently related to a particular computer or other apparatus. Various general purpose machines may be used with programs written in accordance with the teachings herein, or it may prove convenient to construct more specialized apparatus to perform the required method steps. The required structure for a variety of these machines will appear from the description given.

What has been described above includes examples of the disclosed architecture. It is, of course, not possible to describe every conceivable combination of components and/or methodologies, but one of ordinary skill in the art may recognize that many further combinations and permutations are possible. Accordingly, the novel architecture is intended to embrace all such alterations, modifications and variations that fall within the spirit and scope of the appended claims.

The various elements of the devices as previously described with reference to FIGS. 1-15 may include various hardware elements, software elements, or a combination of both. Examples of hardware elements may include devices, logic devices, components, processors, microprocessors, circuits, processors, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. However, determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that make the logic or processor. Some embodiments may be implemented, for example, using a machine-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

It will be appreciated that the exemplary devices shown in the block diagrams described above may represent one functionally descriptive example of many potential implementations. Accordingly, division, omission or inclusion of block functions depicted in the accompanying figures does not infer that the hardware components, circuits, software and/or elements for implementing these functions would necessarily be divided, omitted, or included in embodiments.

At least one computer-readable storage medium may include instructions that, when executed, cause a system to perform any of the computer-implemented methods described herein.

Some embodiments may be described using the expression "one embodiment" or "an embodiment" along with their derivatives. These terms mean that a particular feature, structure, or characteristic described in connection with the embodiment is included in at least one embodiment. The appearances of the phrase "in one embodiment" in various places in the specification are not necessarily all referring to the same embodiment. Moreover, unless otherwise noted the features described above are recognized to be usable together in any combination. Thus, any features discussed separately may be employed in combination with each other unless it is noted that the features are incompatible with each other.

Terminology

Tool Implant Metrics—Objects to measure to confirm wafer will be implanted as expected, e.g., energy, species, charge, ROI current, beam height, beam width, angles, angle spread, etc.

Control Inputs/Tuning Knobs—Set of parameters used to create desired Tool Implant Metrics, e.g., Accel, Manipulator position, Analyzer Current, Focus Voltage, Extraction Voltage, Q3, Corrector Current, etc.

Dependent Outputs—parameters which vary with control inputs but are not part of the set of process metrics. For example, using a current controller setting as an input, but use its voltage feedback as a dependent output for inferring impedance.

Stress Vector—set of parameters that measure wear and tear on tool, e.g., extraction current & voltage hours by species, gas flow rates, pump/vent cycles, robot moves, etc.

Guide Star Alignment (GSA)—the use of specific setups to do long optical baseline alignment such as source magnet to filter magnet to manipulator to analyzer to corrector to MPXL beam X offset.

Perturbation Sequences for Alignment and Calibration (PSAC)—single GSA can be inconclusive due to combined interactions of Manipulator, Analyzer Current (multiple unknowns). Orthogonal perturbations can provide sufficient 'multiple equations' for solving 'multiple unknowns' for n-dimensional calibration Process Param Sieve—Large set of process params (Metrics) derived from training set and/or forward process model stored as large vector set (~100,000). As customers pin down aspects of desired process params, the set intersection is calculated, with user input restricted to set intersection. This makes sure that the desired process parameters can be achieved by the tool. Can be used offline and displayed as set of micro histograms that adjust to process param windows Back Propagation (Stochastic)—working backwards from outputs to inputs, assessing what minor nudge to previous layer results in a move towards the desired output (i.e. do a better job predicting the output). These are done in batches, with the nudges stochastically combined.

Locked Layer Learning—Allows Back Propagation to pass through Neural Net (NN) layers for the purpose of updating only those layers that are not locked Gradient Based Saliency Map—back propagation of an output difference or perturbation to identify the most important inputs that affected that difference Regression Neural Network—unlike a classifier network, which uses a Boolean activation function (each neuron evaluates to 0 or 1), a regression NN uses a linear activation function (a bias plus a sum of all values connecting from previous layer). The result is a continuous output value Transfer Learning—Model trained on one thing can be repurposed to do a related task Invertible Neural Network (INN)—If input layer variation always results in unique outputs, the model can be run forward to create a training set where the outputs become the inputs. If there are cases where output may be duplicated for 2 or more different inputs, we have two options for inverting the model: (1) Identify duplicates, score them and eliminate all but best output; and (2) Introduce an attribute to the output layer that categorizes each one of the duplicates appropriately.

It is emphasized that the Abstract of the Disclosure is provided to allow a reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. A method, comprising:
generating a first histogram for a first setting parameter of an ion implanter, the first histogram comprising a graphical representation of a distribution of data points across a first range of values associated with the first setting parameter;

generating a second histogram for a second setting parameter of the ion implanter, the second histogram comprising a graphical representation of a distribution of data points across a second range of values associated with the second setting parameter;

presenting the first histogram and the second histogram on a graphical user interface (GUI) of an electronic device;

receiving a control directive from the GUI to modify the first range of values associated with the first setting parameter;

predicting a modification to the second range of values associated with the second setting parameter based on the modification to the first range of values associated with the first setting parameter by a machine learning (ML) model; and presenting the second histogram for the second setting parameter on the GUI to indicate the modification to the second range of values associated with the second setting parameter.

2. The method of claim 1, wherein the first histogram comprises a minimum selector element and a maximum selector element, the minimum selector element to control selection of a minimum value for the first range of values associated with the first setting parameter, and a maximum selector element to control selection of a maximum value for the first range of values associated with the first setting parameter.

3. The method of claim 1, wherein the first setting parameter comprises a control parameter, and the second setting parameter represents a process parameter, a qualifier parameter, or a preventative maintenance (PM) phase parameter.

4. The method of claim 1, wherein the mean process model comprises a feed forward neural network, the feed forward neural network trained to receive as input a control parameter and predict a process parameter, a qualifier parameter, or a preventative maintenance (PM) cycle parameter.

5. The method of claim 1, wherein the first setting parameter comprises a control parameter that corresponds to a hardware or software setting that controls a configuration or operation of a component of the ion implanter, the at least one control parameter comprising a charge parameter, an energy parameter, an acceleration or deceleration parameter, a dopant and flow parameter, a diluent and flow parameter, a source parameter, an analyzer parameter, a corrector parameter, a suppression parameter, a focus parameter, a scan parameter, a quadrupole lens current parameter, or a post-acceleration voltage parameter.

6. The method of claim 1, wherein the second setting parameter comprises a process parameter that corresponds to a metric associated with a beam property for an ion beam generated by the ion implanter, the at least one process parameter comprising a beam height parameter, a beam width parameter, full half height maximum (FHHM) parameter, a vertical within device angle (VWIDA) parameter, a VWIDA mean (VWIDAM) parameter, a horizontal within device angle (HWIDA) parameter, a HWIDA mean (HWIDAM) parameter, a standard deviation of VWIDA (VWIDAS) parameter, a standard deviation of HWIDA mean (HWIDAS) parameter, a vacuum interface (VI) parameter, a width (full not half) parameter, a spotscore parameter, an energy parameter, a region of interest (ROI) current parameter, or a uniformity parameter.

7. The method of claim 1, wherein the second setting parameter comprises a qualifier parameter that corresponds to a tune time parameter, a stability parameter, a tunability parameter, a shape quality parameter, a stress vector impact parameter, or a wear parameter.

8. The method of claim 1, comprising configuring a component of the ion implanter based on the modification to the first range of values associated with the first setting parameter, the first setting parameter to comprise a control parameter for the component of the ion implanter.

9. The method of claim 1, comprising generating an ion beam by the ion implanter based on the modification to the first range of values associated with the first setting parameter, the first setting parameter to comprise a control parameter for a component of the ion implanter.

10. An ion implanter, comprising:

an ion source to generate an ion beam;

at least one beamline component to direct the ion beam towards a substrate;

a processing circuitry; and a memory coupled to the processing circuitry, the memory storing instructions that, when executed by the processor circuitry, configure the processing circuitry to:

generate a first histogram for a first setting parameter of an ion implanter, the first histogram comprising a graphical representation of a distribution of data points across a first range of values associated with the first setting parameter;

generate a second histogram for a second setting parameter of the ion implanter, the second histogram comprising a graphical representation of a distribution of data points across a second range of values associated with the second setting parameter;

present the first histogram and the second histogram on a graphical user interface (GUI) of an electronic device;

receive a control directive from the GUI to modify the first range of values associated with the first setting parameter;

predict a modification to the second range of values associated with the second setting parameter based on the modification to the first range of values associated with the first setting parameter by a machine learning (ML) model; and present the second histogram for the second setting parameter on the GUI to indicate the modification to the second range of values associated with the second setting parameter.

11. The computing apparatus of claim 10, wherein the first histogram comprises a minimum selector element and a maximum selector element, the minimum selector element to control selection of a minimum value for the first range of values associated with the first setting parameter, and a maximum selector element to control selection of a maximum value for the first range of values associated with the first setting parameter.

12. The computing apparatus of claim 10, wherein the first setting parameter comprises a control parameter, and the second setting parameter represents a process parameter, a qualifier parameter, or a preventative maintenance (PM) phase parameter.

13. The computing apparatus of claim 10, wherein the mean process model comprises a feed forward neural network, the feed forward neural network trained to receive as input a control parameter and predict a process parameter, a qualifier parameter, or a preventative maintenance (PM) cycle parameter.

14. The computing apparatus of claim 10, wherein the second setting parameter comprises a qualifier parameter that corresponds to a tune time parameter, a stability parameter, a tunability parameter, a shape quality parameter, a stress vector impact parameter, or a wear parameter.

15. The computing apparatus of claim 10, the processing circuitry to configure a component of the ion implanter based on the modification to the first range of values associated with the first setting parameter, the first setting parameter to comprise a control parameter for the component of the ion implanter.

16. The computing apparatus of claim 10, the processing circuitry to cause the ion implanter to generate an ion beam based on the modification to the first range of values associated with the first setting parameter, the first setting parameter to comprise a control parameter for a component of the ion implanter.

17. A non-transitory computer-readable storage medium, the computer-readable storage medium including instructions that when executed by a computer, cause the computer to:

generate a first histogram for a first setting parameter of an ion implanter, the first histogram comprising a graphical representation of a distribution of data points across a first range of values associated with the first setting parameter;

generate a second histogram for a second setting parameter of the ion implanter, the second histogram comprising a graphical representation of a distribution of data points across a second range of values associated with the second setting parameter;

present the first histogram and the second histogram on a graphical user interface (GUI) of an electronic device;

receive a control directive from the GUI to modify the first range of values associated with the first setting parameter;

predict a modification to the second range of values associated with the second setting parameter based on the modification to the first range of values associated with the first setting parameter by a machine learning (ML) model; and present the second histogram for the second setting parameter on the GUI to indicate the modification to the second range of values associated with the second setting parameter.

18. The computer-readable storage medium of claim 17, wherein the first histogram comprises a minimum selector element and a maximum selector element, the minimum selector element to control selection of a minimum value for the first range of values associated with the first setting parameter, and a maximum selector element to control selection of a maximum value for the first range of values associated with the first setting parameter.

19. The computer-readable storage medium of claim 17, wherein the first setting parameter comprises a control parameter, and the second setting parameter represents a process parameter, a qualifier parameter, or a preventative maintenance (PM) phase parameter.

20. The computer-readable storage medium of claim 17, wherein the mean process model comprises a feed forward neural network, the feed forward neural network trained to receive as input a control parameter and predict a process parameter, a qualifier parameter, or a preventative maintenance (PM) cycle parameter.

* * * * *